United States Patent
Peng et al.

(10) Patent No.: US 8,287,656 B2
(45) Date of Patent: Oct. 16, 2012

(54) METHODS FOR CORRELATING GAP VALUE TO MENISCUS STABILITY IN PROCESSING OF A WAFER SURFACE BY A RECIPE-CONTROLLED MENISCUS

(75) Inventors: G. Grant Peng, Fremont, CA (US); Cristian Paduraru, Pleasanton, CA (US); Katrina Mikhaylich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/241,122

(22) Filed: Sep. 22, 2011

(65) Prior Publication Data

US 2012/0006359 A1   Jan. 12, 2012

Related U.S. Application Data

(62) Division of application No. 12/246,461, filed on Oct. 6, 2008, now Pat. No. 8,051,863.

(60) Provisional application No. 60/999,585, filed on Oct. 18, 2007.

(51) Int. Cl.
*B08B 3/04* (2006.01)

(52) U.S. Cl. .......................... 134/18; 134/25.4

(58) Field of Classification Search .................... 134/18, 134/25.4, 902
See application file for complete search history.

(56) References Cited

U.S. PATENT DOCUMENTS

| | | | | |
|---|---|---|---|---|
| 3,953,265 | A * | 4/1976 | Hood | 438/8 |
| 4,021,278 | A * | 5/1977 | Hood et al. | 438/8 |
| 6,021,789 | A * | 2/2000 | Akatsu et al. | 134/57 R |
| 6,754,980 | B2 * | 6/2004 | Lauerhaas et al. | 34/594 |
| 6,929,903 | B2 * | 8/2005 | Itoh et al. | 430/329 |
| 6,988,327 | B2 * | 1/2006 | Garcia et al. | 34/407 |
| 7,000,622 | B2 * | 2/2006 | Woods et al. | 134/94.1 |
| 7,093,375 | B2 * | 8/2006 | O'Donnell | 34/79 |
| 2001/0032657 | A1 * | 10/2001 | Itzkowitz | 134/1.3 |

FOREIGN PATENT DOCUMENTS

JP   2006-080403   *   3/2006

* cited by examiner

*Primary Examiner* — Frankie L Stinson
(74) *Attorney, Agent, or Firm* — Martine Penilla Group, LLP.

(57) ABSTRACT

Methods for monitoring meniscus processing of a wafer surface to stabilize a meniscus are provided. In one example, the processing is in response to a current recipe that defines a desired gap between the wafer surface and a proximity head. The method includes the operations of monitoring current meniscus processing to determine that a current gap is other than the desired gap, and identifying a calibration recipe that specifies the current gap. The method then continues the meniscus processing of the wafer surface using process parameters specified by the identified calibration recipe.

9 Claims, 16 Drawing Sheets

METHODS FOR CORRELATING GAP VALUE TO MENISCUS STABILITY IN PROCESSING OF A WAFER SURFACE BY A RECIPE-CONTROLLED MENISCUS

CLAIM OF PRIORITY

This application is a divisional application of U.S. application Ser. No. 12/246,461 entitled "Methods and Apparatus for Correlating Gap Value to Meniscus Stability in Processing of A wafer Surface by A Recipe-Controlled Meniscus" filed on Oct. 6, 2008 and incorporated herein by reference, and U.S. application Ser. No. 12/246,461 claims priority to U.S. Provisional Application No. 60/999,585 filed on Oct. 18, 2007, titled "Methods of and Apparatus for Correlating Gap Value to Meniscus Stability in Processing of a Wafer Surface by a Recipe-Controlled Meniscus".

BACKGROUND

1. Field of the Invention

The present invention relates generally to wafer processing processes and to equipment for processing wafers, and more particularly to methods and apparatus for correlating gap value to meniscus stability in processing of a surface of a wafer by a recipe-controlled meniscus.

2. Description of the Related Art

In the semiconductor chip fabrication industry, it is necessary to clean and dry a wafer (e.g., a substrate) after a fabrication operation if, e.g., the operation leaves unwanted residues on surfaces of the substrate. Examples of such a fabrication operations include plasma etching and chemical mechanical polishing (CMP), each of which may leave unwanted residues on surfaces of the substrate. Unfortunately, if left on the substrate, the unwanted residues may cause defects in devices made from the substrate, in some cases rendering the devices inoperable.

Cleaning the substrate after a fabrication operation is intended to remove the unwanted residues. After a substrate has been wet cleaned, the substrate must be dried effectively to prevent water or other processing fluid (hereinafter "fluid") remnants from also leaving unwanted residues on the substrate. If the fluid on the substrate surface is allowed to evaporate, as usually happens when droplets form, residues or contaminants previously dissolved in the fluid will remain on the substrate surface after evaporation and can form spots. To prevent evaporation from taking place, the cleaning fluid must be removed as quickly as possible without the formation of droplets on the substrate surface. In an attempt to accomplish this, one of several different drying techniques may be employed such as spin-drying, IPA, or Marangoni drying. All of these drying techniques utilize some form of a moving liquid/gas interface on a substrate surface, which, only if properly maintained, results in drying of a substrate surface without the formation of droplets. Unfortunately, if the moving liquid/gas interface breaks down, as often happens with all of the aforementioned drying methods, droplets form, droplet evaporation occurs, and contaminants remain on the substrate surface.

In view of the foregoing, there is a need for improved cleaning systems and methods that provide efficient substrate cleaning while reducing the likelihood of contaminants remaining on the substrate surface from dried fluid droplets.

SUMMARY

Broadly speaking, the embodiments fill the above need by monitoring processing of a surface of a wafer by a recipe-controlled meniscus. A processor is configured for response to orientation monitor signals to allow maintaining meniscus stability. The orientation monitor signals allow this meniscus stability by maintaining a meniscus configuration in one continuous length between process monitoring beams and extending continuously across a gap between a fluid emitter surface of a proximity head and the wafer surface. The needs are further filled by calibration data that defines recipes corresponding to a stable meniscus. In meniscus processing using a current recipe, identification of an undesired gap is correlated to the calibration data to allow meniscus processing to be maintained (i.e., continue) with a stable meniscus.

It should be appreciated that the present invention can be implemented in numerous ways, including as a method, a process, an apparatus, or a system. Several inventive embodiments of the present invention are described below.

In one embodiment, apparatus is provided for monitoring meniscus processing of a wafer surface to maintain meniscus stability. The processing is according to a recipe. A processor is configured to respond to orientation monitor signals and to a current recipe for generating meniscus monitor signals to allow maintaining meniscus stability.

In another embodiment, apparatus is provided for monitoring processing of a wafer surface using a meniscus, the monitoring avoiding meniscus separation by maintaining the meniscus stable during the processing. The processing is in response to a recipe. Meniscus monitors are configured to separately receive a return laser beam from each respective opposite side of a wafer carrier for generating a separate orientation monitor signal representing the relative orientation of the wafer surface and a fluid emitter surface at the respective side. A processor is configured to respond to the orientation monitor signals and to a current recipe for generating meniscus monitor signals for allowing the stable meniscus to be maintained during further meniscus processing.

In another embodiment, a method is provided for monitoring meniscus processing of a wafer surface to stabilize the meniscus. The processing is in response to a current recipe that defines a desired gap between the wafer surface and a proximity head. An operation monitors current meniscus processing to determine that a current gap is other than a desired gap. A calibration recipe is identified and specifies the current gap. Continued meniscus processing of the wafer surface uses process parameters specified by the identified calibration recipe.

In another embodiment, a method is provided for monitoring meniscus processing of a wafer surface to maintain a meniscus in a stable condition, the processing being in response to a current recipe that specifies a desired gap between the wafer surface and a proximity head. The current recipe further specifies process parameters for the meniscus processing. An operation is performed to monitor current meniscus processing to determine whether a current gap is other than a desired gap and is configured with gap values to allow the meniscus to be maintained in the stable condition. If the current gap is determined to be other than the desired gap and is so configured, an operation identifies a calibration recipe that specifies the current gap and calibrated process parameters for use in establishing a stable meniscus across the current gap. An operation of automatic adjusting of the process parameters of the current recipe to the process parameters of the identified calibration recipe is done, and the meniscus processing of the wafer surface is continued using the process parameters specified by the identified calibration recipe.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1:
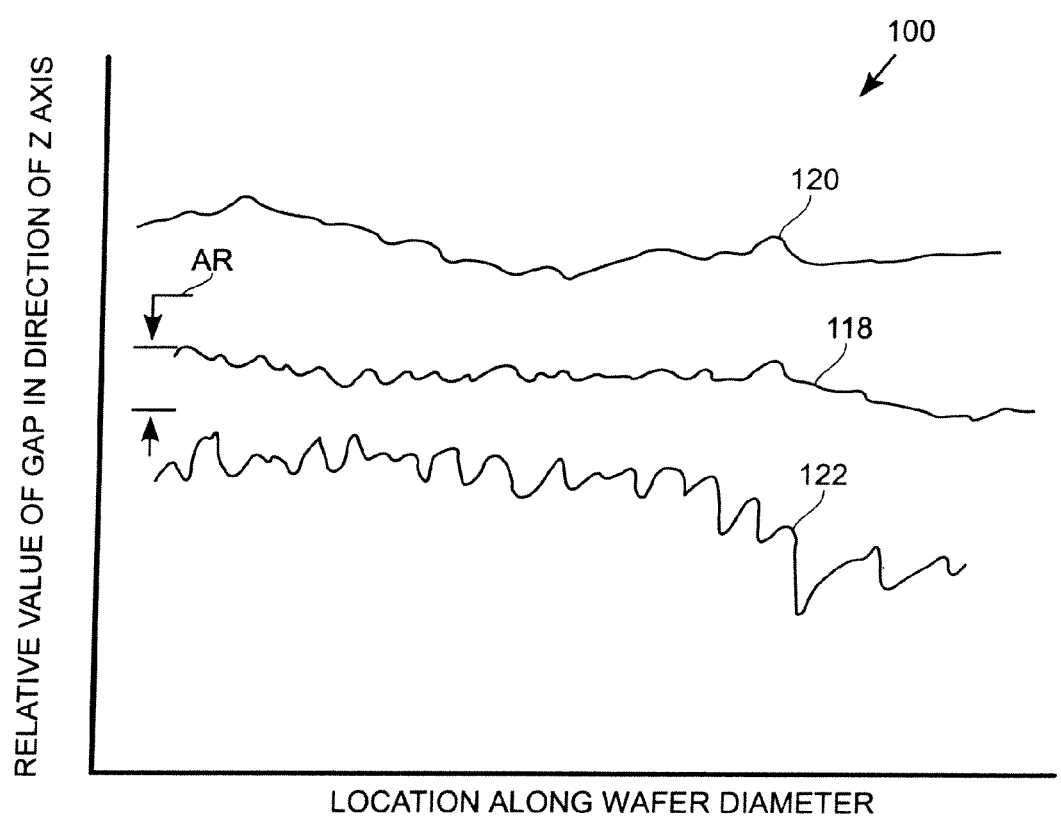
FIG. 1 is a graph showing curves defined relative values of a gap and to locations across a wafer, the relative values being between a proximity head and the surface of a wafer, the curves relating the relative values to meniscus stability according to embodiments of the present invention.

Several exemplary embodiments are disclosed, which define examples of monitoring of meniscus processing of a surface of a wafer. The monitoring is of a gap between a proximity head and the wafer. The gap is spanned by the meniscus. Gap value and variations of the gap value during processing are correlated to meniscus stability during the processing. Meniscus stability is in terms of a continuous configuration of the meniscus, the continuous configuration being without separation of the meniscus (i.e., without meniscus breakup). As a result, the monitoring may result in continued meniscus processing of the wafer surface by allowing the continuous configuration to be maintained. In one embodiment, apparatus monitors meniscus processing of a wafer surface to maintain meniscus stability, and the processing is according to a recipe. A meniscus monitor system mounted on a proximity head generates plural orientation monitor signals representing the relative orientation of a wafer surface and a proximity head during processing in response to a current recipe. A processor is configured to respond to the orientation monitor signals and to the current recipe for generating meniscus monitor signals to allow maintaining meniscus stability.

In another embodiment, there is a method of monitoring meniscus processing of a wafer surface to stabilize the meniscus. The processing is according to a current recipe that defines a desired gap between the wafer surface and a proximity head. An operation of the method monitors current meniscus processing to determine that a current gap is other than a desired gap. Another operation identifies a calibration recipe that specifies the current gap. The identified calibration recipe is known to specify process parameters for a stable meniscus. An operation continues the meniscus processing of the wafer surface using process parameters specified by the identified calibration recipe to maintain the meniscus stable.

In another embodiment, there is a method of monitoring meniscus processing of a wafer surface to maintain a meniscus in a stable condition, the processing being in response to a current recipe that specifies a desired gap between the wafer surface and a proximity head. The current recipe further specifies process parameters for the meniscus processing. An operation monitors current meniscus processing to determine whether a current gap is other than a desired gap and is configured with gap values to allow the meniscus to be maintained in the stable condition. An operation is effective if the current gap is determined to be other than the desired gap and is so configured, and identifies a calibration recipe that specifies the current gap and calibrated process parameters for use in establishing a stable meniscus across the current gap. An operation automatically adjusts the process parameters of the current recipe to the process parameters of the identified calibration recipe. Another operation continues the meniscus processing of the wafer surface using the process parameters specified by the identified calibration recipe.

Several inventive embodiments of the present invention (herein referred to as "embodiments") are described below. It will be apparent to those skilled in the art that the present invention may be practiced without some or all of the specific details set forth herein.

The word "wafer," as used herein, denotes without limitation, semiconductor substrates, hard drive disks, optical discs, glass substrates, flat panel display surfaces, liquid crystal display surfaces, etc., on which materials or layers of various materials may be formed or defined in a processing chamber, such as a chamber in which a plasma is established for processing, e.g., etching or deposition. All such wafers may be processed by the embodiments in which improved cleaning systems and methods provide efficient wafer cleaning while reducing the likelihood of contaminants remaining on the wafer surface from dried liquid droplets.

Orientation of the wafer (and of structures) is described herein in terms of orthogonal X, Y and Z axes. Such axes may define directions, such as directions of surfaces or of movements or of planes, etc.

The word "meniscus," as used herein, refers to a volume of liquid bounded and contained in part by surface tension of the liquid. In the embodiments, the meniscus in the contained shape can be moved relative to a surface. The "surface" may be a surface of a wafer ("wafer surface"), or a surface of a carrier ("carrier surface") that mounts the wafer, for example. The term "W/C surface" refers collectively to the wafer surface and the carrier surface. A desired meniscus for meniscus processing is stable. The stable meniscus has a continuous configuration. This configuration is continuous completely across a desired width (see W below, FIG. 2D) in the X direction and across a desired length (see LD, FIG. 2E) in the Y direction and the meniscus extends continuously across a desired gap in the Z direction (FIGS. 2D & 2E). In specific embodiments, the meniscus may be established to be stable in this continuous configuration by the delivery of liquids to the W/C surface while also removing the liquids from the W/C surface. Further, meniscus stability is allowed to be maintained by using a calibration recipe, or by varying a gap value.

The term "proximity head", as used herein, refers to an apparatus that can receive liquids, apply the liquids to the W/C surface, and remove the liquids from the W/C surface, when the proximity head is placed in close relation to the W/C surface. The close relation is when there is a small (e.g., four mm) gap between (i) the carrier surface (or the wafer surface) and (ii) a surface ("head surface") of the proximity head that applies the meniscus to the W/C surface. Thus, the head is spaced by the gap from the W/C surface. In one embodiment, the head surface is placed substantially parallel to the wafer surface and substantially parallel to the carrier surface (e.g., in set-up). A portion of the meniscus may thus be defined between the head surface and the wafer surface, and another portion of the meniscus may thus be defined between the head surface and the carrier surface. These portions of a stable continuous meniscus are continuous with each other to define one meniscus.

The term "placed in close relation to" refers to "proximity" of the head surface and the W/C surface, the proximity being defined by the gap. The gap is a proximity distance measured in the Z direction. Different degrees of proximity are possible by adjusting the relative Z direction positioning of the carrier and the head surface, e.g., during set-up. In one embodiment, exemplary proximity distances (gaps) may be between about 0.25 mm and about 4 mm, and in another embodiment may be between about 0.5 mm and about 1.5 mm, and in a most preferred embodiment the gap may be about 0.3 mm. In one embodiment the proximity head receives a plurality of liquid inputs and is also configured with vacuum ports for removing the received liquids.

By controlling the delivery to, and removal of the liquids from, the meniscus, the meniscus can be controlled and moved relative to the W/C surfaces. In some embodiments, during the processing the wafer may be moved, while the proximity head is still, and in other embodiments, the head may be moved while the wafer remains still. Further, for completeness, it should be understood that the processing can occur in any orientation, and as such, the meniscus may be applied to W/C surfaces that are not horizontal (e.g., carriers or wafers that are at an angle to horizontal). A preferred embodiment is described in which: (i) the wafer is moved by the carrier in the X direction, (ii) a desired orientation of the W/C surfaces is horizontal and parallel to the head surface (i.e., in an X-Y plane), (iii) the proximity head is still, (iv) the length of the head surface extends in the Y direction across the W/C surface and is passed by the carrier and wafer moving parallel to the X direction, (v) the head surface and the W/C surface are spaced by a desired gap having a uniform value (i.e., uniform in the Z direction across the entire X and Y direction extents of the gap), and (vi) the meniscus is stable and extends in a continuous configuration (i.e., without separation) across the gap and thus extends continuously in each of the X, Y & Z directions across the gap.

The term "recipe" refers to computer data, or information in other form, that defines, or specifies, (1) process parameters for a desired meniscus process to be applied to the wafer; and (2) physical parameters related to establishing the gap. For the liquid or liquids that define the meniscus, the process parameters can include the type of liquid, and the pressures, flow rates and chemistries of the liquid. For the meniscus, the process parameters can include the size, shape and location of the liquid meniscus. For the relative movement between the proximity head and the W/C surface, the process parameters can include (i) the rate of travel of the carrier with respect to the proximity head, which may be constant or vary depending on the position of the carrier with respect to the proximity head, e.g., the rate of travel of the carrier may be slower as the meniscus transitions on and off the wafer, providing additional time for the meniscus liquid to flow out of the gap between the carrier and the wafer; and (ii) timing of the control of any of the other process parameters according to the rate of travel or the location of the wafer relative to the proximity head. For the meniscus, the physical parameters can include data defining where and by how much the proximity head is located with respect to the carrier and the wafer.

Analysis by the Applicants of the present invention indicates that one problem in the use of a recipe-controlled meniscus defined between the proximity head and the W/C surface to be processed may be overcome by the embodiments. The problem is the trend in semiconductor chip manufacturing to use wafers having greater and greater diameters. For example, the diameters have ranged from the early 25.4 mm diameter through much iteration to the later 200 mm diameter that in 2007 is being displaced by 300 mm diameter wafers, and in 2007 predictions are for use of a 450 mm diameter, e.g., by 2013. When the proximity head spans a Y direction distance more than the wafer diameter, and when the wafer diameter becomes larger and larger, the meniscus length LD must become longer and longer in the Y direction so as to process the entire wafer in one relative motion between the proximity head and the wafer. The analysis also indicates that the problem relates to a desire to increase throughput of wafers processed by such a meniscus, e.g., to increase the speed of movement of the wafer relative to the proximity head during meniscus processing. With increases in both meniscus length and the relative speed, such Applicants have identified the stability of such a meniscus and the stability of that relative movement as being related to obtaining desired results of the meniscus processing. The analysis by such Applicants indicates needs for a system for monitoring the value of the gap between the proximity head and the W/C surfaces during meniscus processing of the wafer. Also indicated is a need to correlate gap value and variations of the gap value during processing, to meniscus stability during the processing. The meniscus stability is in terms of (i) providing the continuous configuration of the meniscus, and (ii) maintaining the continuous configuration of the meniscus, without separation (i.e., without meniscus breakup) during meniscus processing. Related needs are also for calibration data that specifies process and physical parameters for specific gap values, where the data corresponds to a stable meniscus. The needs are also for performing the correlation using a monitored current gap value to identify one of the calibration recipes that specifies the monitored current gap value. The needs are also for using the results of the correlation (i.e., using the identified calibration recipe) to specify process parameters that may be used to allow a stable meniscus to be maintained. By filling these needs the system avoids damage to the wafer due to the head touching the wafer while allowing the wafer diameter to be longer in the Y direction and allowing the relative movements to be at an increased rate, for example.

Figure 4A:
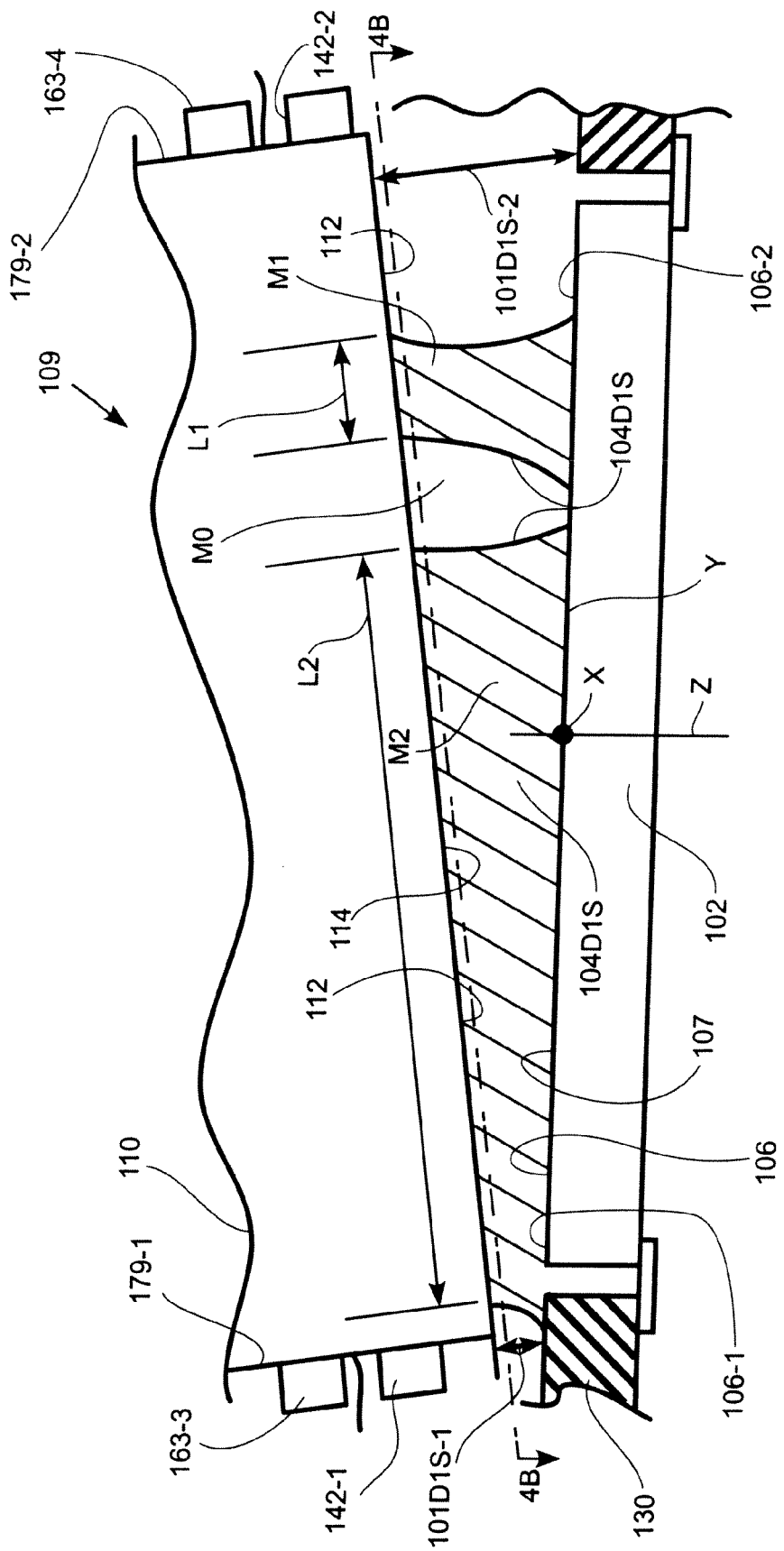
FIGS. 4A and 4B are respective elevational and plan views showing exemplary undesired breaks in the meniscus avoided by the depicted embodiments.

With the above overview in mind, reference is now made to exemplary structure configurations for filling these and other needs, which will enable avoiding damage to the wafer due to the head touching the wafer, while allowing increases in both the wafer diameter and the rate of relative head-to-wafer surface movements. FIG. 1 illustrates a graph 100. Data shown in FIG. 1 may be understood by reference to FIGS. 2A-2E, in which the orthogonal X, Y and Z axes are shown. Graph 100 shows relative values of a gap 101, and one gap embodiment is shown as 101D in FIGS. 2D and 2E. Specific gap values are not shown, but are referred to below as GVD, GVU, GVCAL, and GVN, for example. In FIG. 1, the relative gap values are plotted against location along a diameter D (FIG. 2B) of a wafer 102 that is being meniscus processed (i.e., processed by a recipe-controlled meniscus, referred to generally as 104). In one embodiment, the wafer 102 is moved in the X direction shown in FIG. 2A. In FIGS. 2C-2E, meniscus 104 is shown in a stable configuration (referred to as 104D with respect to FIGS. 2D and 2E). In contrast, FIG. 4A shows an embodiment of the meniscus, referred to as meniscus 104DIS, and the meniscus contacts a surface 106 of the wafer. Surface 106 may define a wafer plane 107 shown in FIGS. 2D & 2E. As described below, in set up for processing the wafer is initially mounted parallel to an axis plane 108 (FIG. 2D) that is defined by the X and Y axes. FIG. 2D also shows the wafer with a wafer thickness T that extends parallel to the Z direction. Apparatus 109 is described for monitoring each meniscus 104 to allow the stable and continuous meniscus configuration to be maintained.

FIG. 2C shows one embodiment of the apparatus 109 including a pair of proximity heads 110 straddling the wafer 102 in the Z direction, and extending across (and beyond) the diameter D (FIG. 2B) of the wafer 102 in the Y direction. The description below refers to one such head 110, it being understood that such description applies to each of the heads 110 shown in FIG. 2C. A head surface, or fluid emitter surface, 112 of the head 110 is shown, with the surface configured to define a head, or reference, plane 114. In set-up, reference plane 114 is set parallel to the axis plane 108 (FIG. 2D). In meniscus processing of the wafer surface 106, it is intended that the head 110 & reference plane 114 be stationary in each of the X, Y & Z directions. In practice, the head 110, and thus the surface 112 and head plane 114, may not remain parallel to the wafer plane 107 during processing.

FIGS. 2D and 2E show one of the head surfaces 112 spaced from the upper wafer surface 106. The gap 101 identifies such space and is the gap that is identified in FIG. 1. The gap 101 is shown in FIGS. 2D and 2E as a desired gap 101D and is between the respective head surface 112 and the respective wafer surface 106. The gap 101D is specified for the desired meniscus 104D having a desired gap value GVD that is in the desired range AR (FIG. 1), as described below. The desired gap shown in FIGS. 2D & 2E as 101D has the gap value GVD that is uniform, i.e., is the same all across the X, Y & Z directions. Other gaps 101 are as described below.

The desired gap 101D may be further described as follows with respect to FIGS. 2D & 2E. With the head surface 112 coincident with the reference plane 114, the wafer surface 106 and the wafer plane 107 may be in the axis plane 108, and the head surface 112 (and plane 114) may be parallel to the axis plane 108. In this embodiment (with parallel wafer plane 107 and head plane 114), there is a relative orientation of the wafer 102 and the head 110. The relative orientation is a desired orientation in which the desired gap 101D has the uniform gap value GVD. The uniform gap value may preferably be a value in the above desired range AR, for example. FIG. 2E shows the uniform gap value extending in the Y direction all along the length LD, including across and beyond the diameter D of the wafer 102. In this referenced embodiment with the uniform gap 101D in the above desired range AR and with the meniscus 104D provided according to process parameters PRP, the meniscus 104D is said to be "stable" and is identified in FIG. 1 by curve 118. Curve 118 illustrates oscillations in amplitude that are small relative to amplitude oscillations of curve 122. Curve 118 also indicates that the relative values of the gap are within range AR. Curve 120 shows relative gap values for a case in which the W/C surface does not interact with a meniscus because the meniscus (and vacuum) in the head 110 are turned off. Curve 120 provides a reference situation enabling one to observe variations when there are W/C surface interactions with the meniscus. Curve 120 is shown having a decreasing relative gap value from left to right, indicating that the wafer is not properly placed in the carrier. By the embodiments, the amplitude oscillations in the curves are correlated to observations of the meniscus configuration at the time the amplitude oscillations were obtained. As a result of the observed meniscus configurations, the related amplitude oscillations may be correlated to meniscus stability and instability, as defined above. The observations may, for example, be visual observations of the current meniscus, and a record of meniscus stability and instability is related to currently monitored amplitude oscillations. In another embodiment, photographic or video observations may be evaluated and correlated to meniscus stability and instability. As a result, meniscus stability may be correlated to the range AR of relative gap values, and as described below, ranges beyond range AR may be related to meniscus stability and instability.

Figure 2A:
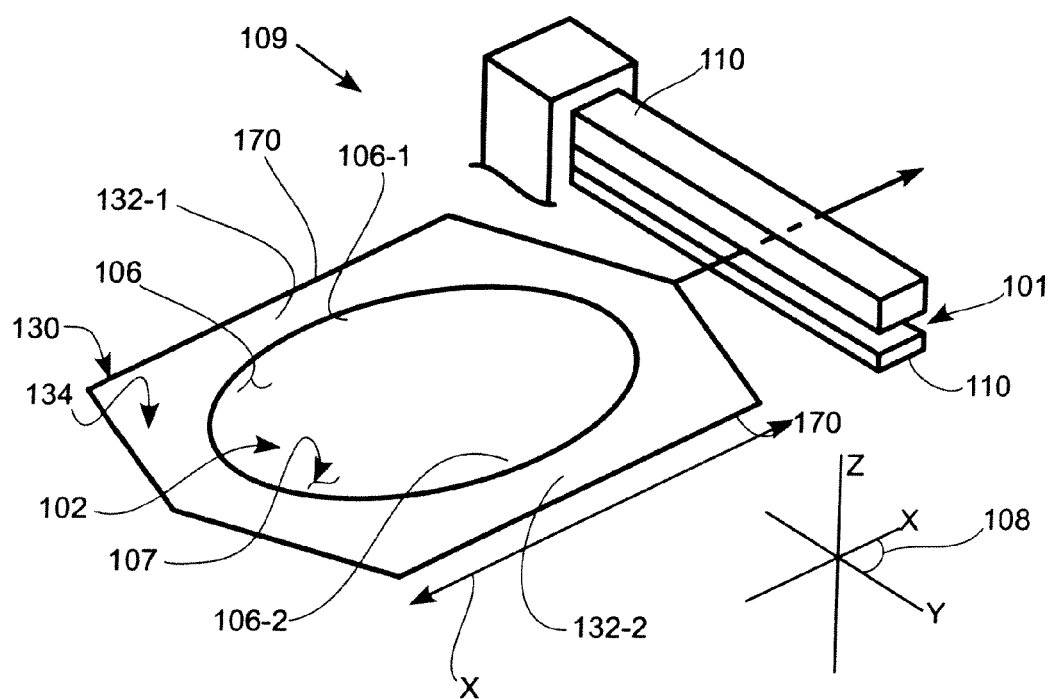
FIG. 2A is a perspective view showing a carrier moving the wafer past the proximity head during wafer processing in embodiments of the present invention.
Figure 2B:
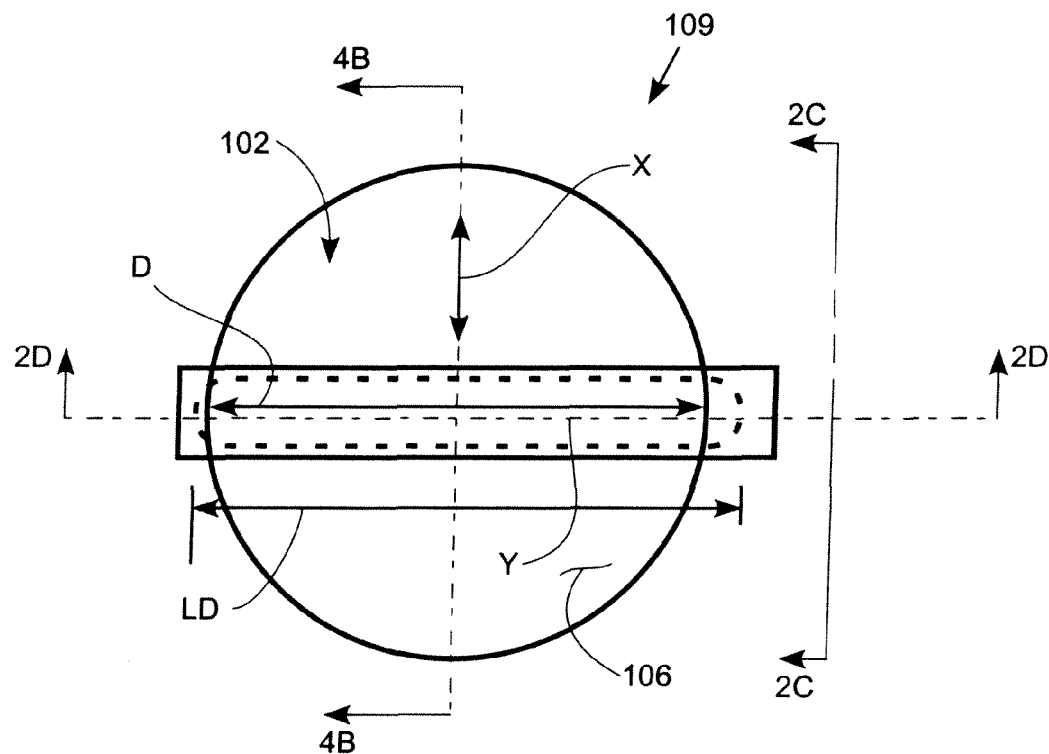
FIG. 2B is a plan view showing the wafer being processed by the meniscus according to embodiments of the present invention.
Figure 2C:
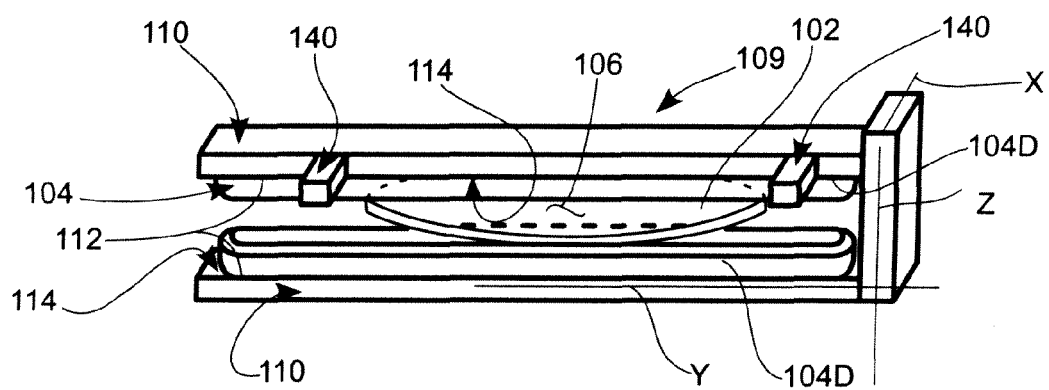
FIG. 2C is a perspective view showing the meniscus during the wafer processing by the embodiments of the present invention.
Figure 2D:
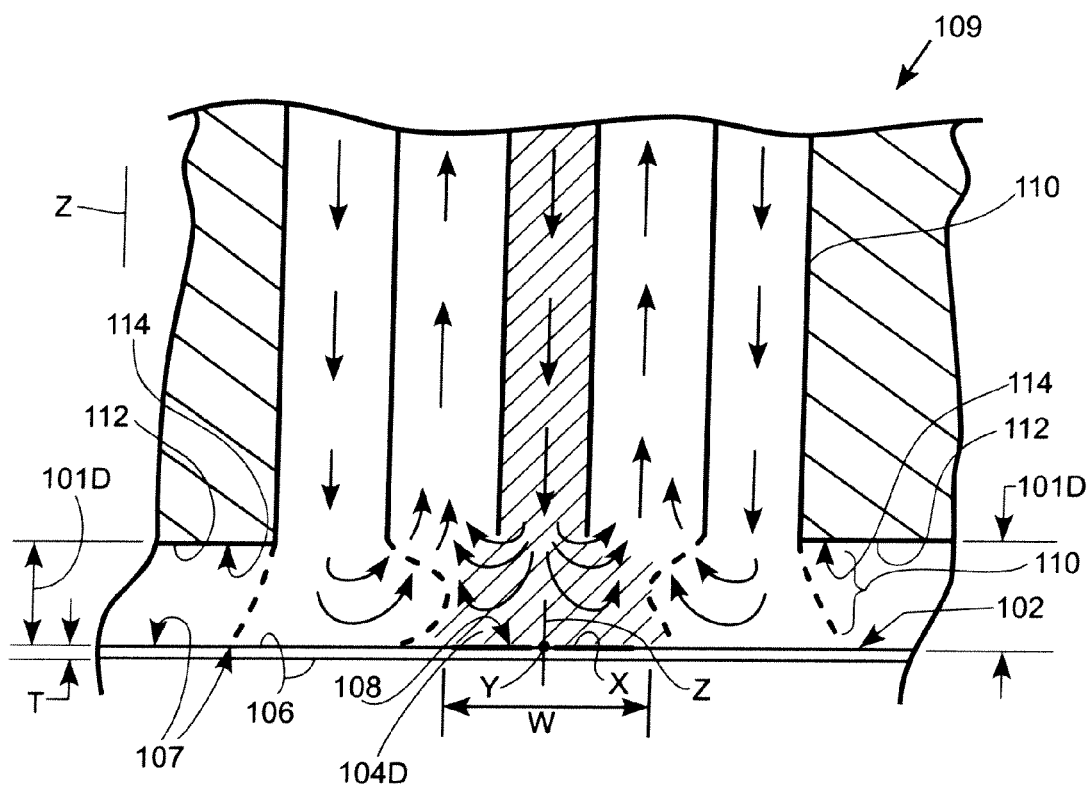
FIGS. 2D and 2E are enlarged elevational views showing a stable meniscus during the wafer processing.
Figure 2E:
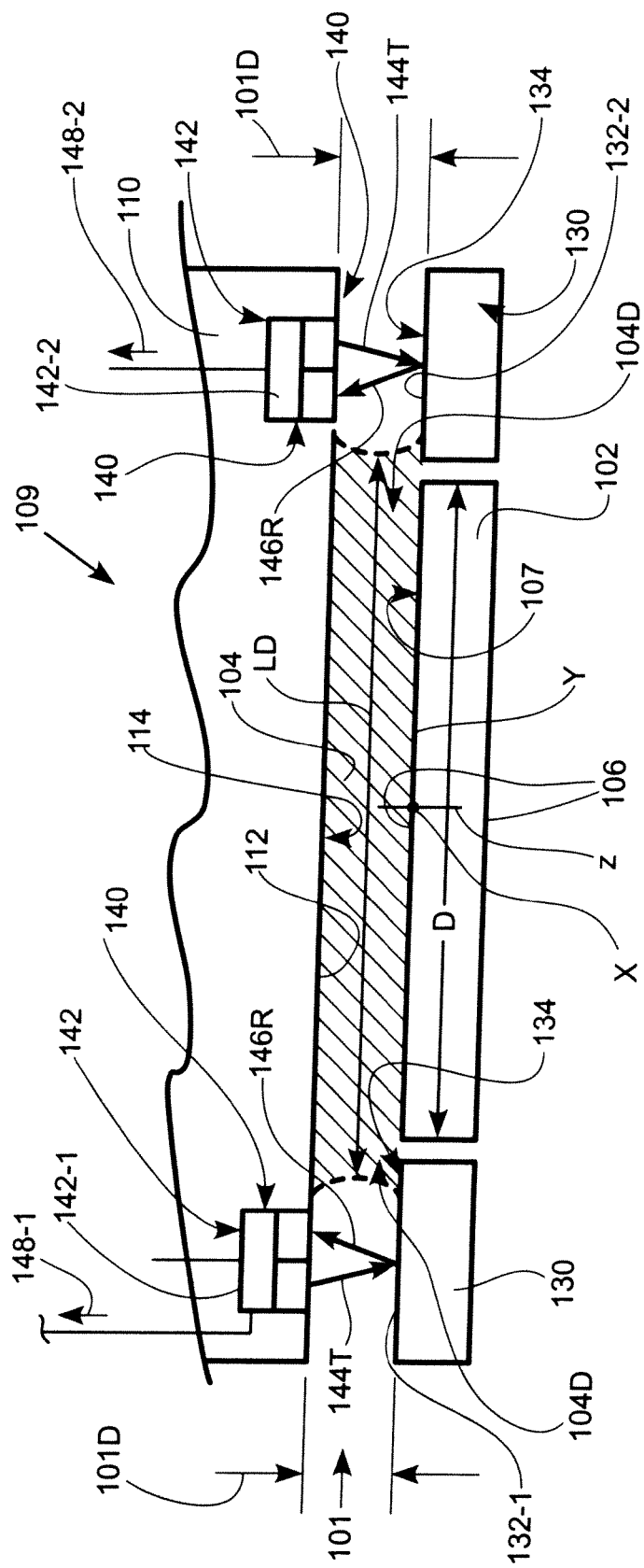

FIG. 2A also generally shows the apparatus 109 configured with an embodiment of a carrier 130. The carrier is configured to mount the wafer 102 for desired movement relative to the proximity heads 110 with each wafer surface 106 in the desired orientation relative to the respective head plane 114 of the respective head 110. Generally, the desired movement is in the X direction. As described above with respect to FIGS. 2D and 2E, such desired movement in the desired orientation is with the wafer surfaces 106 and the respective head plane 114 spaced from each other by the gap 101D, in which the gap value GVD is uniform (i.e., desired).

Figure 3A:
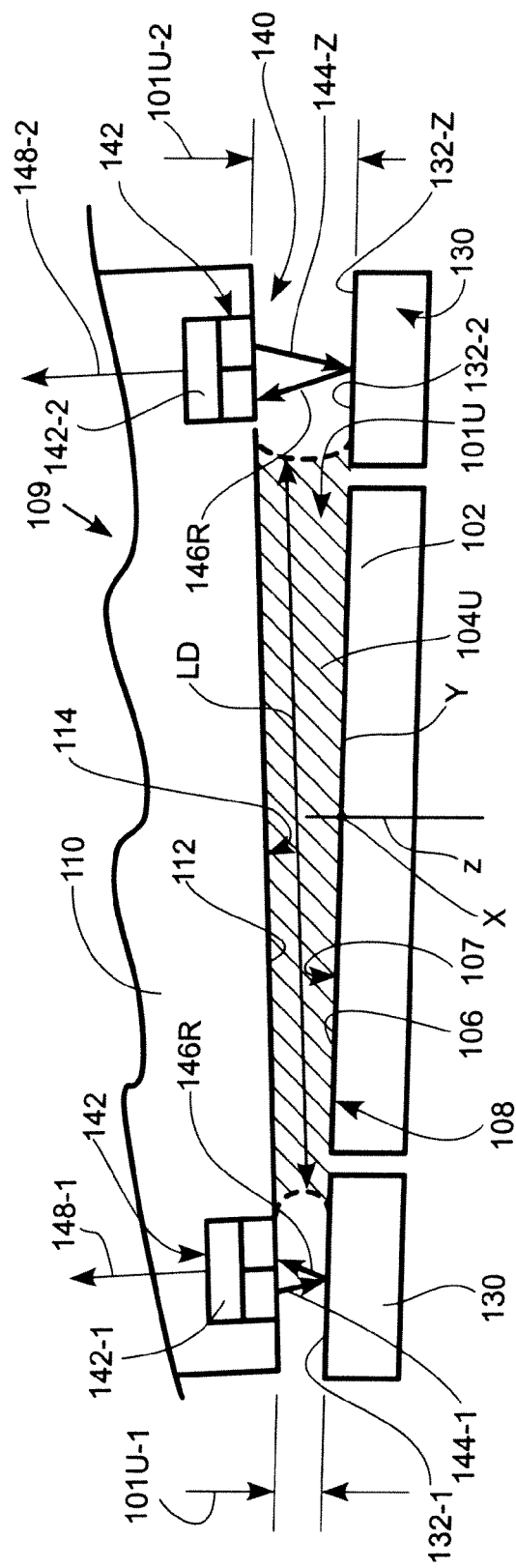
FIG. 3A is an elevational view showing a plane of the head in an undesired tilted orientation relative to the surface of the wafer.
Figure 3B:
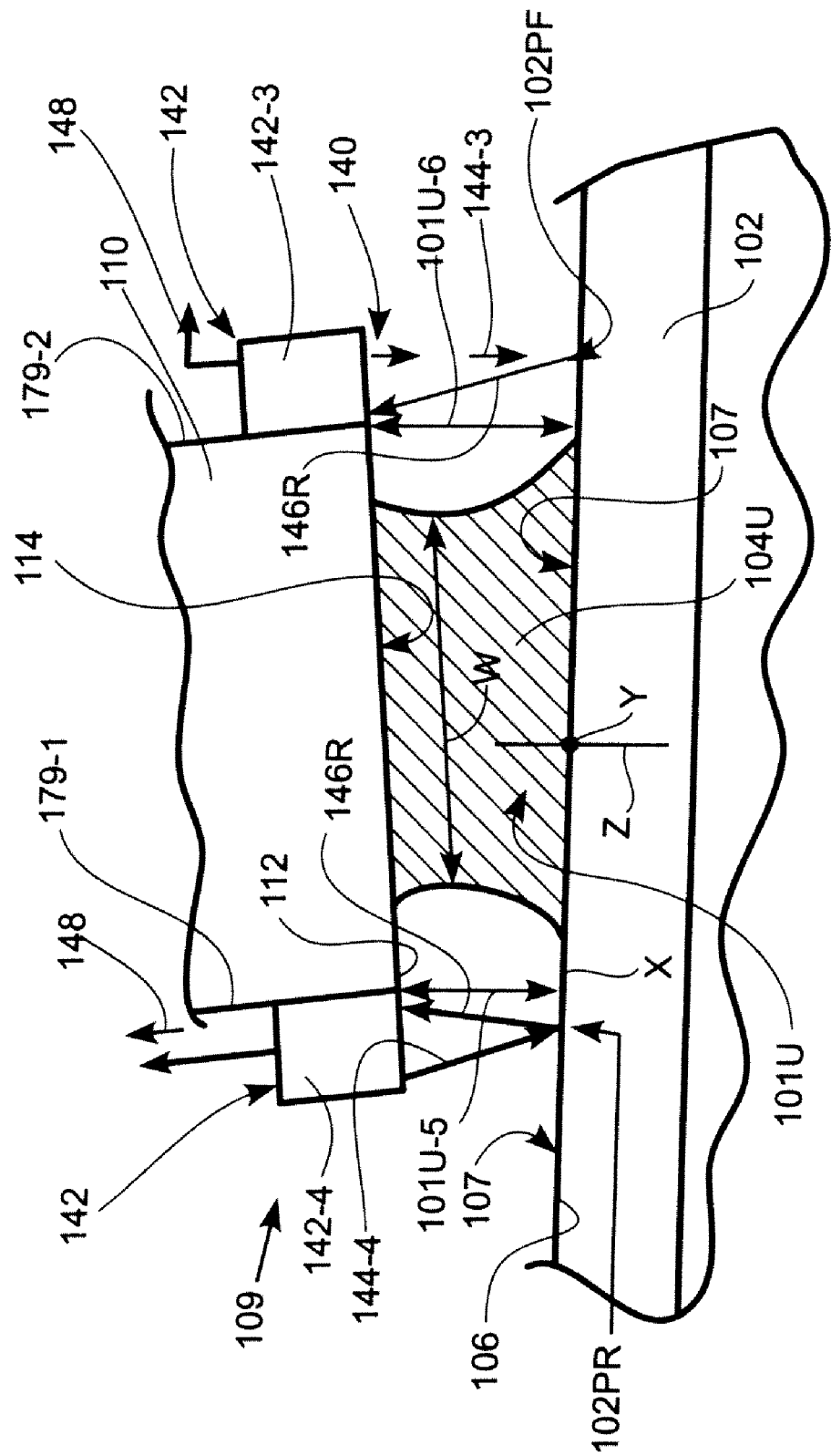
FIG. 3B is an elevational view showing the plane of the head in an undesired pitched orientation relative to the surface of the wafer.

Generally, in another embodiment shown in FIGS. 3A and 3B, one head 110 is shown. The wafer movement relative to the head 110 may also include movement with the wafer surface 106 and the head surface 112 in an undesired relative orientation relative to each other. Generally, the undesired relative orientation (also referred to as an undesired orientation) is with the value of the gap (shown as 101U) including one or more gap values GVU other than the uniform value GVD (shown as 101U-1, 101U-2, 101U-5, & 101U-6). One undesired orientation may be tilted as shown in FIG. 3A, such that the gap is non-uniform and undesired and the gap value is not in range AR. However, the gap value GVU may be within a range MAR of acceptable gap values as described below with respect to Table I. Generally, the range MAR may be acceptable because with the use of the embodiments, the meniscus (identified as 104U in FIGS. 3A & 3B) is allowed to be maintained stable. This gap 101U is undesired because, without the embodiments, the meniscus 104 may be rendered (or become) unstable as the gap changes from uniform to non-uniform.

Generally, in one embodiment a gap value in a DIS range is a gap value outside of both the acceptable gap value of range AR and the range MAR, both as described below (Table I). The DIS range is a most undesired relative orientation, where "most" is more undesired than the undesired orientation of the gap 101U. The most undesired relative orientation corresponds to the meniscus being discontinuous, or separated (identified as meniscus 104DIS in FIGS. 4A & 4B described below). An example of a gap value less than a value in the acceptable gap value range AR and less than a value in the MAR range is a gap value at an extremely low value, i.e., in which a zero gap value corresponds to touching of the respective head surface 112 and the respective wafer surface 106. The touching renders the meniscus 104DIS discontinuous. Such a discontinuous meniscus is most undesired because the processing must be stopped when the meniscus 104DIS occurs.

The undesired orientations may be understood by further reference to the carrier 130. The carrier configuration is shown in FIG. 2A with opposite carrier sides 132-1 and 132-2. The carrier sides 132-1 and 132-2 define a carrier plane 134 that in the desired orientation is co-planar with (i) one wafer surface 106, and (ii) one wafer plane 107, and is parallel to the axis plane 108 (FIGS. 2D & 2E). Sides 132-1 and 132-2 are adjacent to opposite sides 106-1 and 106-2 of the one wafer surface 106. In an undesired orientation of the head plane 114 relative to the carrier 130, the head plane 114 is not parallel to the carrier plane 134 or to the wafer plane 107 or to the axis plane 108, such that the gap values at the sides 132-1 and 132-2 are unequal, indicating existence of the undesired, non-uniform gaps 101U (shown as 101U-1 & 101U-2 in FIG. 3A).

In more detail, the cross sectional view of FIG. 3A shows one embodiment in an undesired orientation. An exemplary one of the two wafer surfaces 106 and the head plane 114 are in the undesired orientation relative to each other. The X-Y plane is shown for reference as coplanar with the wafer plane 107 (the X axis being shown as dot X). The head plane 114 of head 110 is not parallel to the Y axis (i.e., is at an acute angle with respect to wafer plane 107). The meniscus length LD is shown greater than diameter D (FIG. 2A) of the wafer 102. The meniscus 104U extends between the head surface 112 and the wafer surface 106. In a general sense, the undesired orientation illustrated in FIG. 3A is shown as the head 110 rotated around the X axis, with the head plane 114 tilted relative to the Y axis. The values of the gap 101U are shown including one or more values other than the uniform value of the gap 101D. Thus, the gap 101U relative to the head 110 is shown with a value 101U-1 adjacent to one edge 132-1 of the wafer 102. Value 101U-1 is substantially smaller than the gap value 101U-2 adjacent to the opposite edge 132-2 of the wafer 102. With respect to FIG. 3A, this undesired orientation is referred to as the head 110 being tilted, as if the left side of the wafer were "hovering" (i.e., tilted up) and the right side of the wafer were tipped (i.e., tilted down). A tilted undesired orientation may also be oriented opposite to that shown in FIG. 3A, i.e., as if the right side of the wafer were hovering (i.e., tilted up) and the left side of the wafer were tipped (i.e., tilted down).

The cross sectional view of FIG. 3B shows another embodiment of an undesired orientation. An exemplary wafer surface 106 and head surface 112 are in a pitched undesired orientation relative to each other. The axes are shown for reference. The wafer surface 106 and plane 107 are shown coplanar with the axis plane 108 (the Y axis being shown as a dot). A meniscus width W of the meniscus 104U is shown. In a general sense, this undesired orientation illustrated in FIG. 3B is shown as the head 110 rotated around the Y axis, and the head plane 114 pitched from and not parallel to the X axis. The values of the gap 101U are shown including one or more values other than the uniform value of gap 101D. Thus, the gap 101U relative to the head 110 is shown with one value 101U-5 and one value 101U-6. Value 101U-6 extends in the Z direction from adjacent to a forward up pitched location of the head 110 (shown at the right) to a forward location on the wafer 102. Value 101U-6 is shown substantially larger than the value 101U-5 that extends in the Z direction from adjacent to a rear down pitched location of the head 110 (shown at the left) to a rear location on the wafer 102. Such locations may be on the diameter D of the wafer, for example. This undesired orientation is referred to as the head 110 being pitched up. A pitched undesired orientation may also be oriented opposite to that shown in FIG. 3B, i.e., with the front side of the head down and the rear side of the head up.

With the undesired meniscus in mind, the contrasting desired meniscus stability may be understood. The above-referenced continuous configuration of the meniscus is without separation of the meniscus (i.e., without meniscus breakup). FIGS. 2D and 2E show meniscus stability via stable meniscus 104D. For example, in FIG. 2E the length LD of the desired meniscus 104D extends in the Y direction across the proximity head 110, past the outer edge of the wafer 102 and onto the carrier 130. In another example, in FIG. 2D the width W of the meniscus 104D extends in the X direction without interruption. In other words, the meniscus 104D is continuous completely across the width W. Also, in each FIGS. 2D and 2E the meniscus 104D is shown extending continuously across the desired gap 101D in the Z direction. The stability of the desired meniscus 104D is also indicated by the gap 101D having the gap value GVD in the desired range AR.

Figure 4B:
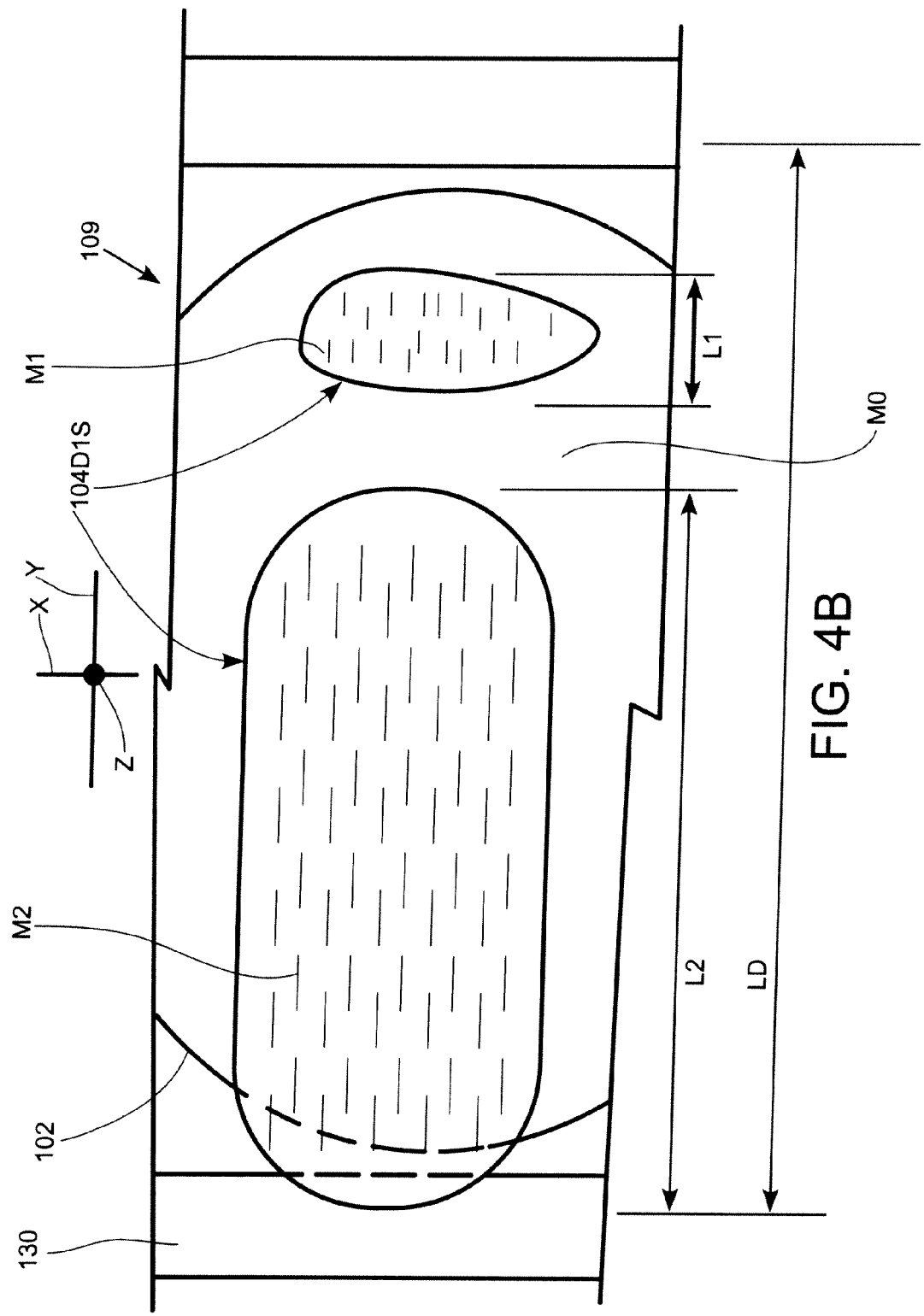

In contrast to such meniscus stability, details of the unstable meniscus 104DIS may be understood by further reference to FIGS. 4A and 4B. FIG. 4A shows meniscus 104DIS extending generally in the Y direction in two separate parts M1 and M2, and thus in an incomplete configuration, incompletely across the proximity head 110. Only in exemplary part M2 does the meniscus 104DIS extend past the outer edge 106-1 of the wafer 102 and onto the carrier 130. The Y direction lengths of the separate parts M1 and M2 are thus separate lengths L1 and L2 (FIG. 4A), and not one length LD (i.e., not desired length LD of FIG. 2E that extends continuously in one length and completely). In another example, in the plan view of FIG. 4B, meniscus 104DIS is shown extending in the Y direction with an interruption MO in which the meniscus 104DIS does not exist. In other words, in this example, the meniscus 104DIS in two separate parts M1 and M2 is not continuous and is incomplete across the normal length LD of a desired meniscus 104D. Thus, in each of FIGS. 4A and 4B the depicted meniscus 101DIS is shown broken up, illustrating the undesired meniscus breakup.

As previously described, Applicants have identified the need for monitoring the value of the gap 101 between the surface 112 of the proximity head 110 and the wafer surface 106 that is being meniscus processed to allow the stable meniscus configuration to be maintained. FIGS. 3A & 3B also show one embodiment of the apparatus 109 configured with a monitor system 140 for such monitoring. The description below refers to one such system 140 on one proximity head 110, it being understood that such description of the one system 140 applies to a monitor system 140 on each of the heads 110 shown in FIG. 2C. Thus, system 140 may include various meniscus monitors 142 mounted on each of the proximity heads 110. In one embodiment shown in FIG. 3A, one meniscus monitor 142-1 may be configured to direct (or transmit) a separate beam 144-1 (such as a laser beam) onto one of the opposite carrier sides 132-1, and another meniscus monitor 142-2 may be configured to direct (or transmit) a separate similar beam 144-2 onto the other opposite carrier side 132-2. Each of the meniscus monitors 142 may be configured to receive a return, or return beam, 146R of the respective beam 144 from the respective opposite carrier side 132 and to generate an orientation monitor signal (generally 148). Signals 148-1 and 148-2 may be generated by the respective meniscus monitors 142-1 and 142-2. For each meniscus monitor 142, the monitor signals 148 represent the returns 146R modified according to the value of the gap 101 at each respective first and second carrier side 132-1 & 132-2 as compared to the respective first and second beams 144. The monitors 142 may, for example, be a Keyence LK series laser displacement sensor supplied by Keyence Corporation of America. Output orientation monitor signals 148 may be calibrated in set up relative to a laser calibration fixture mounted on the same supports on which the heads 110 are show mounted in FIG. 2C. As calibrated, the orientation monitor signals 148 represents the returns 146R modified according to the value of the gap 101 at each respective first and second carrier side 132-1 & 132-2 as compared to the respective first and second beams 144. The modification, and thus the values of the orientation monitor signals 148, represent gap values that are according to (i) whether the wafer surface 106, as mounted on the carrier 130, and the head surface 112 are in the desired orientation with respect to each other (with the gap 101D having the desired gap value GVD, gap 101D being shown in FIGS. 2D & 2E), or (ii) whether the wafer surface 106 and the head surface 112 are in one of the undesired orientations (e.g., with the gap being the gap 101U having values other than the desired value, FIG. 3A, 101U-1 & 101U-2), or (iii) whether the wafer surface 106 and the head surface 112 are in the most undesired relative orientation corresponding to the meniscus 104DIS that is discontinuous (FIGS. 4A & 4B). In exemplary case (ii), the monitor signals 148 may represent the returns 146R modified according to the gap values of the gap 101U resulting from the above-described exemplary tilting, e.g., of the head surface 112 and the wafer surface 106 relative to each other.

As described above, the gaps 101U between the proximity head 110 and the wafer surfaces 106 that are being meniscus processed may also be defined when the surface 106 of the wafer 102 and the head plane 114 are pitched relative to each other. To allow maintaining proper meniscus processing of the wafer surfaces 106 (e.g. with the stable meniscus 104D), FIG. 3B also shows that the apparatus 109 is configured for monitoring by an embodiment of the monitoring system 140 that includes other meniscus monitors 142 mounted on each of the proximity heads 110. The description below refers to one such system 140 on one proximity head 110, it being understood that such description of the one system 140 applies to the monitor systems 140 provided each of the heads 110 shown in FIG. 2C. FIG. 3B shows that one meniscus monitor 142-3 may be configured to direct (or transmit) a separate similar beam 144-3 onto a forward pitched location 102PF on one surface 106 of the wafer 102, and another meniscus monitor 142-4 may be configured to direct (or transmit) a separate similar beam 144-4 onto a rear pitched location 102PR on that one surface 106 of the wafer 102. Each of these meniscus monitors 142-3 and 142-4 may be configured to receive a return 146R of the respective beam 144 from the respective location 102PF or 102PR to generate another orientation monitor signal 148 in a manner similar to that described with respect to FIG. 3A. The modifications of the beams are according to whether the wafer surface 106 and the head surface 112 are oriented relative to each other in: (i) the desired orientation with the gap 101D having the desired value (shown in FIG. 2D), or (ii) one of the undesired pitched orientations with the gap 101U having values 101U-5 and 101U-6 other than the desired value (FIG. 3B), or (iii) one of the most undesired relative orientations corresponding to the meniscus being discontinuous (FIG. 4B). In these pitched examples (ii) and (iii), the monitor signals 148 represent the returns 146R modified according to the value of the gap 101 resulting from the above-described exemplary pitching, e.g., of the head surface 112 and the wafer surface 106 relative to each other.

Figure 5:
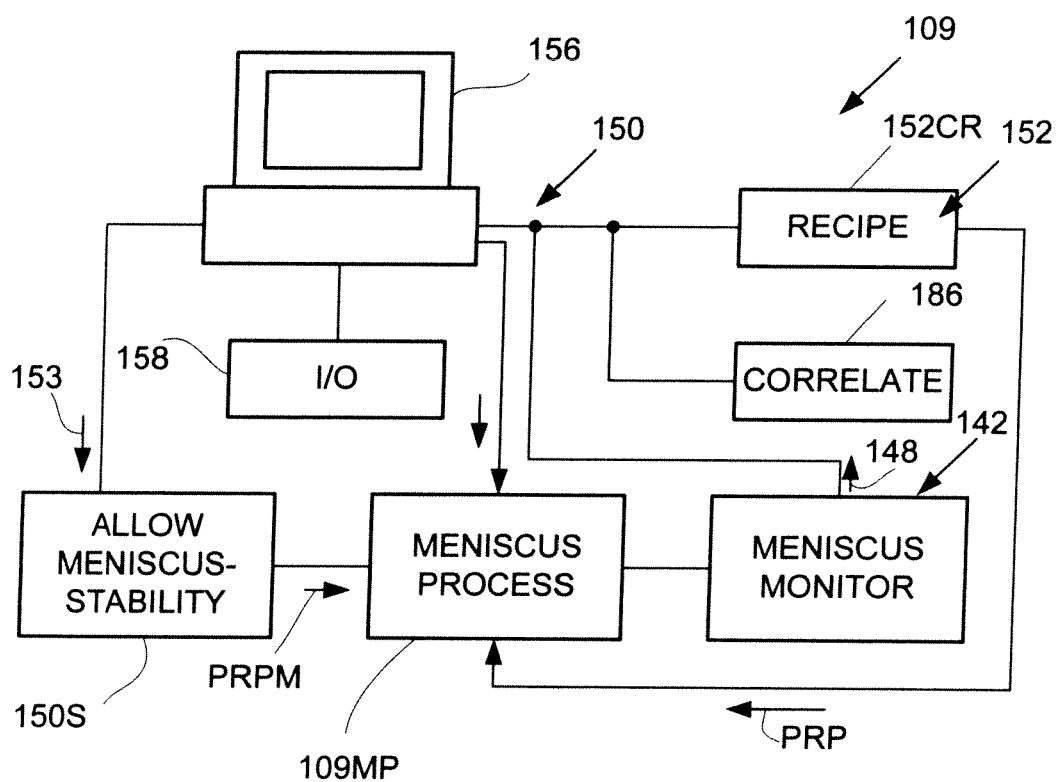
FIG. 5 is a diagram showing a processor configured to respond to an orientation monitor signal and to a recipe that defines parameters for meniscus processing.

The use of orientation monitor signals 148 is described with respect to FIG. 5 that shows the apparatus 109 configured with a processor 150. The processor 150 is configured to respond to the orientation monitor signals 148 and to a recipe 152. The recipe 152 may be as defined above for meniscus processing of a particular type of the wafers 102, for example. In a general sense, during exemplary meniscus processing operations on such type of wafer 102, the configured processor 150 may respond to such signals 148 and to the recipe 152 for generating meniscus monitor signals 153 that correlate to meniscus stability. With the signals 153 so correlated to meniscus stability, the signals 153 allow the stable configuration of the meniscus 104D to be maintained (i.e., without the meniscus separation shown in FIGS. 4A & 4B).

Generally, then, based on the signals 153, during the meniscus processing the maintained configuration of the meniscus 104D will be as shown in FIGS. 2D and 2E. Embodiments of the apparatus 109 are described below to illustrate how the signals 153 are correlated to meniscus stability, and how the signals 153 allow the stable configuration of the meniscus 104D to be maintained (i.e., without the meniscus separation shown in FIGS. 4A & B). Generally, Columns 1-3 of Table I above indicate results of the correlation to meniscus stability. Column 1 identifies a correlation result of desired meniscus stability, characterized by existence of the desired gap 101D

TABLE I

| Column 1 | Column 2 | Column 3 |
|---|---|---|
| Desired meniscus stability gap 101D | Undesired meniscus stability Level 2T non-uniform gap 101U2-T with gap value GVU in acceptable range GVU-T2 | Stop meniscus process unstable meniscus 104DIS |
| uniform gap value GVD | Level 2P non-uniform gap 101U2-P, with gap value GVU in acceptable range GVU-P2 | Level 3T, with gap value GVDIS |
| Level 1, desired meniscus 104D Data 154-1 | adjust process parameter(s) Data 154-2 | Level 3P, with gap value GVDIS Data 154-3 | having a desired uniform gap value GVD. Column 1 identifies a correlation of desired meniscus stability that is characterized by the continuous meniscus configuration and the existence of the desired gap 101D having a Level 1 of desired uniform gap value GVD. Gap value GVD is in the desired (or acceptable) range AR. GVD may be a gap value that is either constant, or is changing with respect to time within the acceptable range AR as shown in FIG. 1. For example, the range AR may be from about 0.1 mm to about 1 mm in a time period of about from ten seconds to ten minutes. It is to be understood that when the gap value GVD is in the desired range AR, the meniscus 104D does not have a tendency to become discontinuous during such time period.

Column 2 identifies a correlation result of a Level 2, that is an undesired meniscus stability. Level 2 is characterized by the existence of any of many undesired gaps 101U. The gap values of the gaps 101U are in one embodiment of the MAR range (outside the range AR), and referred to as MARPRO (referring to process parameter). However, the gap values are such that the meniscus 104U may still be maintained in the stable configuration if the embodiments are used to provide such stability by allowing the modifications (or adjustments) described below. This gap 101U may be referred to as being configured with gap values to allow the meniscus 104U to be maintained in the stable configuration (or condition), because the embodiments may be used and such meniscus stability maintained, as described below. Such modifications relate to certain identified meniscus process parameter PRP values that were specified in the current recipe 152CR for the meniscus process that is being monitored to provide the signals 153. For example, in a Level 2T correlation, a gap 101U2-T identifies a tilt situation in which non-uniform gap values GVU-T2 may be in the MARPRO range (outside the range AR), but the meniscus will have the stable configuration when those modifications are made to the current recipe. In another example, in a Level 2P correlation, a gap 101U2-P identifies a pitch situation in which non-uniform gap values GVU-P2 may be in range MARPRO (outside the range AR), but the meniscus will have the stable configuration when those modifications are made to the current recipe. For example, non-uniform gap values GVU-T2 or GVU-P2 of range MARPRO may be above the range AR by from about one mm to about three mm in a time period of about from ten seconds to about ten minutes, or may be below the range AR by from about 0.1 mm to about 0.3 mm in a time period of from about one second to about two seconds, but the meniscus has the stable configuration when those modifications are made to the current recipe. Column 2 indicates "adjust process parameters", and such adjustment is described below with respect to data 154-3.

Column 3 identifies a Level 3 correlation result of a different type of undesired meniscus stability, and this is the above-described most undesired relative orientation, where "most" is also more undesired than the undesired orientation of the gap 101U. Level 3 is characterized by the existence of one of many undesired gaps 101DIS across which the meniscus 104 currently is not stable, or currently is imminently not going to be stable. In Level 3, the gap 101DIS is such that there is a high risk of an immediate discontinuous configuration (i.e., meniscus separation, FIGS. 4A & 4B). For example, in Level 3 T shown in FIG. 4A the gap 101DIS-1 identifies a tilt situation that may have a gap value DIS that is not in either the MAR range or the AR range. In another example, a Level 3P correlation may have a gap value DIS that is not in either the MAR range or the AR range. The gap value DIS that is not in either the MAR range or the AR range is referred to as being in the DIS range (referring to discontinuous meniscus). With the exemplary gap 101DIS having these non-uniform gap values in the DIS range, there is a basis in each case for immediately interrupting operation of the apparatus 109.

Further considering correlation by the embodiments, in one embodiment of apparatus 109, the current recipe 152CR may specify the process parameters to provide the desired orientation as comprising the desired uniform gap 101D between the wafer surfaces 106 and the fluid emitter surface 112. In this embodiment, the processor 150 may be configured to respond to the orientation monitor signals 148 for correlating the following input values: (1) a value of the uniform gap 101D (specified by the current recipe 152CR), and (2) changes of the value of the gap 101D (which changes may be undesirable, changing the gap 101D to gap 101U, or most undesirable, changing the gap 101D to gap 101DIS) during the meniscus processing. The correlation is to meniscus stability. Generally, the correlation to meniscus stability is via the signal 153 output by the processor 150 representing (or identifying) the data 154 shown in one of Columns 1-3 of Table I. In this general sense, the identified data 154 in the Column indicates the result of the correlation to meniscus stability.

In more detail, the processor 150 correlates those input values (gap and change in gap) with stability of the meniscus 104 for generating the meniscus monitor signals 153. When Column 1 data 154-1 is identified, the signals 153 indicate that the meniscus processing may continue because of the existence of the desired (stable) meniscus 104D.

In another embodiment, the processor 150 also correlates those input values with stability of the meniscus 104 by generating the meniscus monitor signals 153 to identify Level 2T data (of Column 2). In this case, the signals 153 comprise data 154-2 representing a quantitative adjustment amount of an identified one or more of the process parameters PRP. The identified process parameters PRP are those of the process parameters PRP that are to be adjusted to allow the stable meniscus 104U to be maintained. This adjustment of the parameters PRP is from (i) the values that were specified in the current recipe 152CR for the meniscus process, to (ii) values determined by the processor 150 as described below, and may apply to one or both of the tilt and pitch situations.

In another embodiment, the processor 150 also correlates those input values with stability of the meniscus 104 for generating the meniscus monitor signals 153 to identify Level 3 data (of Column 3). When Column 3 data is identified, the signals 153 comprise data representing gaps 101DIS-1 and 101DIS-2 that are a basis for the above-described exemplary immediate interruption of the operation of the apparatus 109, and may apply to one or both of the tilt and pitch situations.

Embodiments of the apparatus 109 illustrate how the signals 153 allow the stable meniscus 104 to be maintained. Table II below indicates exemplary process parameters PRP related to such allowing. The Table II process parameters PRP may be specified by the current recipe 152CR and applied to a meniscus process module 109MP of the processor 150 for process control. At the start of processing, the original process parameters PRP specified by such current recipe 152CR may be referred to below as "OPP" to distinguish from modifications of the parameters PRP that may occur later during processing. In detail, these process parameters PRP may be adjusted (or modified) by the processor 150 to allow the stability of the meniscus 104U to be maintained. Referring again to FIG. 5, the recipe-specified process parameters PRP are applied to meniscus process module 109MP of the apparatus 109. The wafers 102 may initially be processed according to the OPP versions of the process parameters PRP, and the process under current recipe 152CR is monitored by the meniscus monitors 142. Monitors 142 generate the signals 148 according to the orientation of the wafer and the head relative to each other (e.g., Levels 1-3, Table I). In response to the current recipe 152CR, and to the orientation monitor signals 148, the processor 150 generates the meniscus monitor signals 153. In one exemplary embodiment corresponding to Level 2, Table I, the signals 153 provide the data 154-2 to represent a quantitative adjustment amount(s) of an identified one or more of those specified process parameters PRP. Thus, the exemplary data 154-2 may identify the one or more of the parameters PRP that are to be adjusted to allow the configuration of the meniscus 104U to be maintained stable. One example of the identified adjustment is illustrated when the carrier 130 is tilted (as defined above). This adjustment of the identified meniscus process parameters PRP is from (i) the values of the OPP that were originally specified in the current recipe 152CR for the meniscus process module 109MP to use in the meniscus processing, to (ii) values determined by the processor 150 and embodied in the data 154-2. The purpose of the adjustment is to render the meniscus 104U stable and assure that the continuous configuration of the meniscus continues during further meniscus processing of the wafers 102. The identification by the data 154-2 of the signals 153 may, for example, allow different pressures (e.g., greater) to be at locations that correspond to a larger value of the gap 101U, and may allow the different pressures (e.g., lower) at locations that correspond to a smaller value of the gap 101U-1. One skilled in the art may understand that the data 154-2

TABLE II

Exemplary Process Parameters PRP

| Identified and specified process parameters PRP. | Quantitative adjustment amount |
|---|---|
| 1. pressure at which the fluid is supplied from the proximity head 110 into the gap 101; | quantitative adjustment amount of pressure 1 |
| 2. pressure at which the fluid is collected from the gap 101; | quantitative adjustment amount of pressure 2 |
| 3. the velocity of the wafer movement (e.g., in the X direction) relative to the proximity head 110; | quantitative adjustment amount of velocity 3 |
| 4. timing of velocities of such wafer movement relative to the proximity head 110; | quantitative adjustment amount for timing |
| 5. locations at which the fluid is supplied into the gap 101, e.g., locations that are relative to the locations of the meniscus monitors 142, such as along the Y axis; and | quantitative adjustment amount for locations |
| 6. the locations at which the fluid is collected from the gap, e.g., locations along the Y axis. | quantitative adjustments amount for locations |

2 may specify the value of the quantitative adjustment of a process parameter PRP in the same manner as the recipe 152 specifies the original process parameters OPP.

Figure 7:
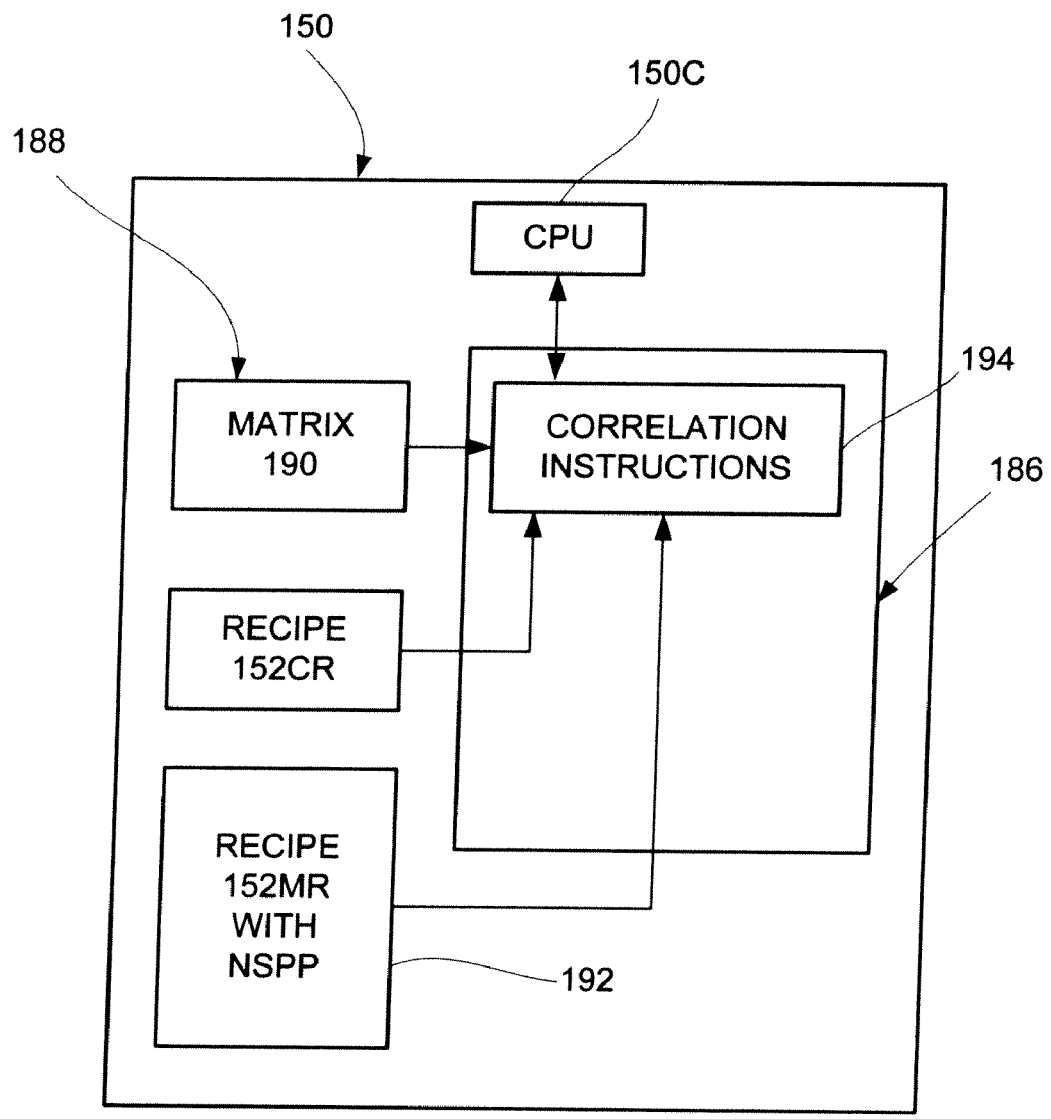
FIG. 7 is a diagram showing a CPU of the processor executing a correlation module to access a database that stores a matrix of recipes to facilitate allowing the maintaining of meniscus stability.

In one embodiment, the data 154-2 of signal 153 may be output on a processor display 156 to present the quantitative adjustment values. Based on the displayed data 154-2, entries may be made by process personnel via I/O such as a keyboard 158 to apply modified parameters PRPM to the process module 109MP. In another embodiment, the data 154-2 may be applied to the process module 109MP by an allow-meniscus-stability program 150S. In yet another embodiment, the modified process parameters PRPM and the unmodified process parameters PRP from the current recipe 152 may be referred to as a modified recipe 152MR (FIG. 7). In each embodiment, the wafers 102 are then processed in response to (i) the modified process parameters PRPM applied by the module 109MP and (ii) applicable unmodified process parameters OPP from the original current recipe 152CR. The meniscus monitors 142 continue to operate and to generate more of the signals 148. In response to the unmodified and modified process parameters of the exemplary modified recipe 152M, and to the current orientation monitor signals 148, the processor 150 continues to generate the meniscus monitor signals 153.

The apparatus 109 may be further configured for operation in a set-up mode with no supply of the fluid into the gap 101 and no collection of the fluid from the gap 101. In the set-up mode the orientation monitor signals 148 collectively indicate whether the head plane 114 is oriented relative to the wafer surfaces 106 and to carrier plane 134 in the desired or in the undesired orientation for a particular recipe 152NCR that is to be used next in meniscus processing. In one embodiment, the recipe 152NCR may be for meniscus operations in response to the current recipe 152CR, where those operations were immediately interrupted in response to the signals 153-3 (Table I). In this situation, the orientation monitor signals 148 indicated the most desired relative orientation between the head and the wafer. In another embodiment, the recipe 152NCR may be a new recipe 152 for a different type of wafer 102. In each case, the specification of the recipe 152NCR includes a gap 101 and a gap value GVN. The carrier 130 and wafer 102 are moved in the X direction relative to the head 110. The relative orientation of the carrier and wafer are monitored by the system 140 as described above, and monitor signals 148 are output to the processor 150. The processor 150 is further configured to respond to these orientation monitor signals 148 in the set-up mode and to the gap value GVN of the next recipe 152NCR for generating a set-up signal 140 defining at least one quantitative adjustment amount QAA by which the head 110 is to be adjusted relative to the carrier 130 if the gap 101 in set up does not have the value GVN of the gap 101 specified in the recipe NCR. By the QAA, an adjustment of the arrays 162 of adjusters 163 described below may be made for set up so that the head 110 is adjusted relative to the carrier 130 and to the wafer 102, and is thus properly set up for the meniscus processing per the next recipe NCR to allow meniscus separation to be avoided and the meniscus 104 to be stable.

Figure 6A:
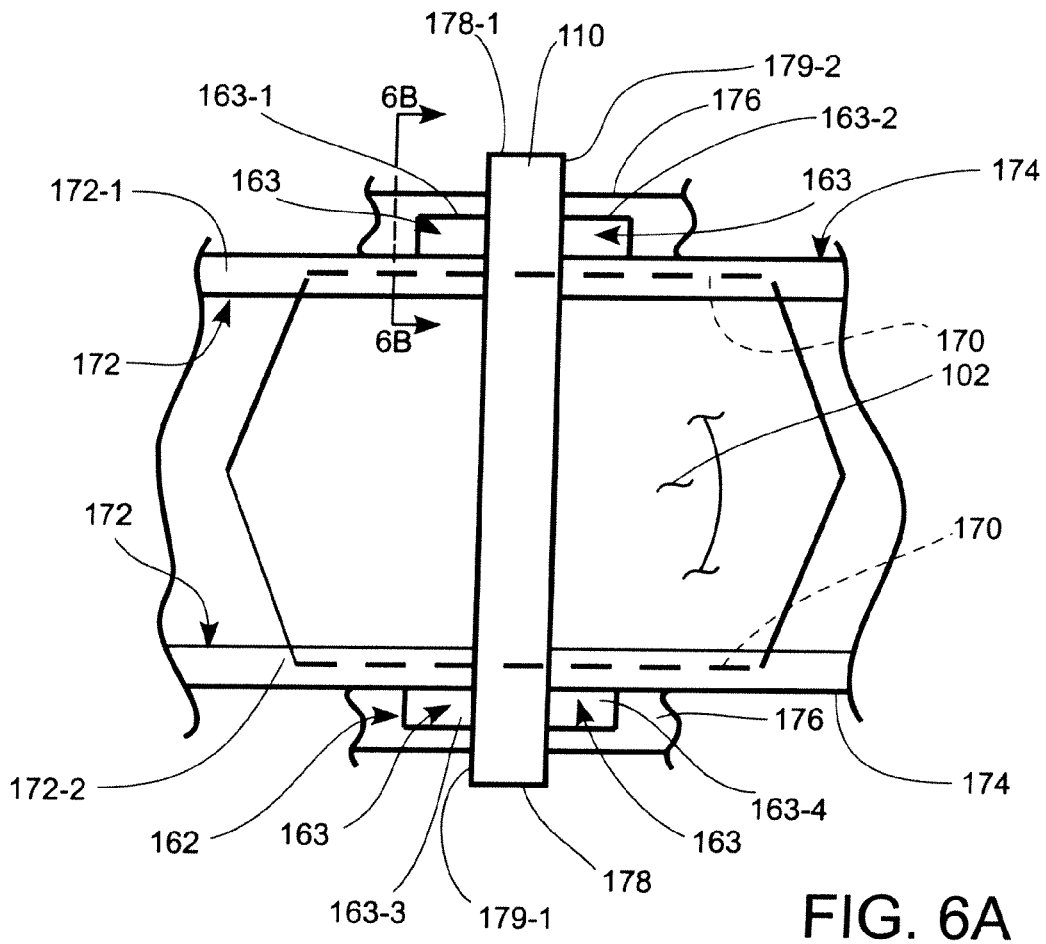
FIG. 6A is a plan view of the proximity head configured with physical parameters for adjustment relative to the carrier.

As described above, the signals 153-3 indicate that the meniscus processing is to be immediately interrupted. On stopping the meniscus processing, or before a new recipe 152NCR is used to meniscus process a new type of wafer, set up is performed. For set up, FIG. 6A shows the array 162 of the adjusters 163. FIG. 6A shows one such head 110, the upper head 110, which is also exemplary of the lower head 110. The exemplary proximity head 110 embodies physical parameters PHP for adjustment by being configured with the array 162 of the adjusters 163 to facilitate the adjustment of the head 110 relative to the carrier 130. The adjusters 163 may be used for adjustment of each of the above-described tilt and pitch, including separately for each or both at the same time. Such tilt is a rotation of the proximity head 110 on (i.e., around) the X axis. Such pitch is a rotation of the proximity head 110 on (i.e., around) the Y axis.

Figure 6B:
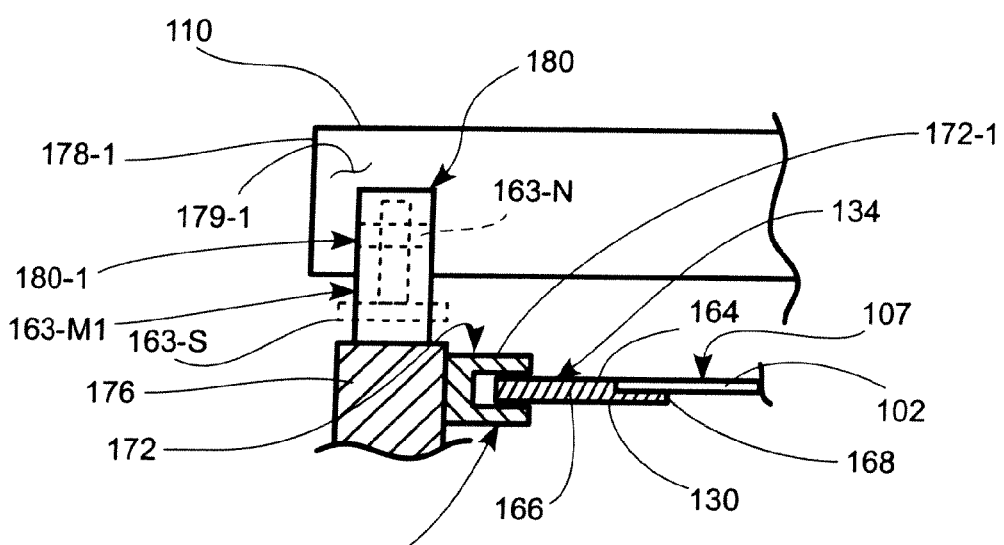
FIG. 6B is an elevational view of one embodiment of the proximity head configured with a physical parameter for manual adjustment relative to the carrier.

The proximity head 110 may be adjusted so that the plane 114 of the head 110 may become less tilted and/or less pitched relative to the plane 134 of the carrier 130 and relative to the plane 107 of the wafer 102. To appreciate these changes in the tilt and pitch, FIG. 6B shows that in this embodiment a stepped opening 164 may be provided in a plate 166 of the carrier 130 to receive the wafer 102. Plate 166 may be provided with support pins 168 to engage the edge of the wafer 102 and hold the wafer with the surfaces 106 co-planar with the carrier plane 134. FIG. 6A shows the wafer plate 166 configured with a generally rectangular perimeter, and the perimeter configured with an outer side edge 170 on each opposite side 132-1 and 132-2. FIG. 6B shows each side edge 170 received in a rail 172 of a track 174. The rails 172 may extend in the + and −X direction relative to the proximity head 110, and are spaced in the Y direction to accommodate the width of the carrier plate 166. The rails 172 extend parallel to the X axis for guiding the respective edge 170 of the carrier 130 in the described + and –X direction movement relative to the head 110.

FIG. 6A also shows one embodiment of the apparatus 109 for use in the initial set up for a new type of wafer, or upon immediate interruption of the meniscus processing. Each corresponding (upper and lower) proximity head 110 is configured with an embodiment of the physical parameter PHP useful for both tilt and pitch adjustment relative to the carrier 130. For the adjustments, the exemplary upper proximity head 110 is configured with the array 162 of the adjusters 163 to permit head orientation adjustment relative to the carrier 130 that is guided by the track 174. Embodiments of the array 162 are first described with respect to tilt, and then with respect to pitch. FIG. 6A shows a general layout for tilt and pitch adjustment of the proximity head 110 by the array 162 configured with the adjusters 163. Adjusters 163-1 and 163-2 are mounted on opposite faces 179-1 and 179-2 of the proximity head 110, and are shown spaced along rail 172-1 in the X direction. Adjusters 163-3 and 163-4 are also mounted on opposite respective faces 179-1 and 179-2 of the proximity head 110 and are shown spaced along opposite rail 172-2 in the X direction. FIG. 6B shows that each adjuster 163 is mounted on a frame 176 that extends between the rails 172 (e.g., 172-1 & 172-2) of the track 174. Adjusters 163-1 and 163-3 are on the –X side of the head 110, and adjusters 163-2 and 163-4 are on the +X side of the head 110. The adjusters 163-1 and 162-2 are also configured to work in unison and together raise, or together lower, side 178-1 of the head 110 relative to the plane 134 of the carrier 130 (e.g., for tilt adjustment). The adjusters 163-3 and 162-4 are also configured to work in unison in the same Z direction and together raise, or together lower, an opposite side 178-2 of the head 110 relative to the plane 114 of the carrier 130 (e.g., for tilt adjustment). The adjusters 163-1 and 163-3 are also configured to work in unison in the same Z direction and together raise or lower one face 179-1 to change the orientation of the head 110 relative to the plane 134 of the carrier 130 (e.g., for pitch adjustment). The adjusters 163-2 and 163-4 are also configured to work in unison in the same Z direction and together raise or lower the other opposite face 179-2 to change the orientation of the head 110 relative to the plane 134 of the carrier 130 (e.g., for pitch adjustment). The exemplary four adjusters 163 are also configured for combined adjustment of both tilt and pitch.

As an example of tilt adjustment, adjusters 163-1 and 163-2 may both be moved up by the same amounts to raise the side 178-1 of the head 110 and change the tilt of the head plane 114 relative to the carrier plane 134. This may change the tilt shown in FIG. 4A, for example. In another example, it may be necessary to make more adjustment to change the tilt of FIG. 4A. Thus, in addition to the described movement of adjusters 163-1 and 163-2 up, adjusters 163-3 and 163-4 may both be moved down to lower the opposite side 178-2 and change the tilt of the head plane 114 relative to the carrier plane 134. The described adjustment of the four of the adjusters 163 may, for example, result in the tilt shown in FIG. 3A, and then further adjustment may equalize all of the gaps 101U-1 through 101U-4, which is an adjustment into the uniform gap situation to obtain the uniform gaps 101D. Opposite tilt would require opposite adjustment of adjusters 163.

As an example for adjusting pitched up orientation (see FIG. 4A showing the front face 179-2 of head 110 pitched up relative to rear face 179-1), FIG. 6A shows that adjusters 163-2 and 163-4 may both be moved down to lower the front face 179-2 on the +X side of the head 110 and change the pitch of the head 110 relative to the carrier 130. This may change the pitched up orientation toward the desired pitch shown in FIG. 3B, for example. In another orientation, additional adjustment may be required. For example, to change the front face up pitch of FIG. 4A, in addition to the described down movement of adjusters 163-2 and 163-4, adjusters 163-1 and 163-3 may both be moved up to raise the rear face 179-1 on the –X side of the head 110. These adjustments may change the relative pitch of the carrier plate 162 and the head plane 114 by, for example, equalizing the gaps 101U-1 through 101U-4, which again is into the uniform gap situation with gap 101D (FIG. 2D). Opposite pitch (i.e., front face down pitch) would require opposite adjustments of adjusters 163.

One exemplary specific configuration of the array 162 is with the adjusters configured as shown in FIG. 6B (an exemplary adjuster being shown as 163-M1). For ease of illustration, the adjuster 163-M1 of FIG. 6B is illustrated only in terms of one side 178, e.g., side 178-1, and only in terms of one face 179, e.g., the –X face 179-1. It is to be understood that the adjuster 163-M1 may also be provided at the opposite front face 179-2 at side 178-1, and at the opposite side 178-2 at each face 179 (FIG. 6A). Each adjuster 163-M1 may be mounted at each such location, and may be configured as shown in FIG. 6B. The frame 176 is shown and extends from side 178-1 to side 178-2 under the respective adjusters 163. An adjustment unit 180 is mounted on the frame 176. In the embodiment 163-M1 of adjuster 163, the unit 180 may be configured for example for manual operation, as by a screw 163-S and a nut 163-N, and is referred to as unit 180-1. Screw 163-S is mounted on the frame 176, held against Z direction motion and free to rotate, while nut 163N is secured to the head 110 not free to rotate, but configured to move the head 110 up and down. Turning of the screw 163-S relative to the frame 176 causes the screw 163-S (threaded in the nut 163-N fixed to the head 110) to move up or down according to the rotational direction of the screw, for example. With the nut 163-N fixed to the head 110, and with the screw 163-S held to allow rotation (but not Z direction motion) relative to the frame 176, rotation of screw 163-S adjusts the vertical position of the nut 163-N, and thus of the head 110, relative to the plate 166, and thus relative to the wafer 102.

TABLE III

Exemplary Physical Parameters PHP: Data 140D

| Identified and specified physical parameters PHP | Quantitative adjustment amount |
| --- | --- |
| 1. tilt: adjust gap value of gaps 101U-1 & 101U-3 | quantitative adjustment amount of gap value |
| 2. tilt: adjust gap value of gaps 101U-2 & 101U-4 | quantitative adjustment amount of gap value |
| 3. pitch: adjust gap value of rear gaps 101U-5 & 101U-7 | quantitative adjustment amount of gap value |
| 4. pitch: adjust gap value of front gaps 101U-6 and 101U-8 | quantitative adjustment amount of gap value |
| 5. adjust all gaps in items 1 and 2 | quantitative adjustment amount of gap values |
| 6. adjust all gaps in items 3 and 4 | quantitative adjustment amount of gap values |

Referring to Table III, the set-up signals 140 may include data 140D. Exemplary data 140D may include the identified and quantitative amounts of specified ones of the physical parameters PHP that are required to make an adjustment of tilt or pitch. The data 140D of Table III may be accessed, for example, by reference to the display 156 (FIG. 5), and the appropriate quantitative adjustment amount, or amounts, may be used to guide the adjustment of the appropriate adjusters 163 as described above for the indicated tilt or pitch situation. Thus, having the quantitative adjustment amount or amounts from the display 156, and with the screw 163-S held against Z motion, rotation of the screw 163-S in an appropriate direction facilitates adjustment of the vertical position of the head 110, e.g., of the face 179 and/or side 178, as described above to adjust tilt or pitch or both tilt and pitch. Such adjustments may be appreciated by reference again to FIG. 4A in which one undesired orientation of the wafer surfaces 106 is shown. The adjusters 163 facilitate adjustment of the vertical position of the head 110 relative to the carrier 130. According to the data 153-3 for the tilt situation, the illustrated tilt of the wafer 102 may thus be reduced into the orientation shown for example in FIG. 2E in which the gap 101D is uniform and desired, allowing the stable meniscus 104D to be maintained. The amount of the adjustment will conform, for example, to that shown in Table III, items 1 and/or 2, corresponding to data 140D of the set-up signal 140. Alternatively, according to the pitch data of set-up signal 140, the illustrated pitch of the wafer 102 may thus be reduced, as shown for example in FIG. 2D in which the gap 101D is uniform and desired, allowing the stable meniscus 104D to be maintained. The amount of the adjustment will conform, for example, to that shown in Table III, items 3 and/or 4, corresponding to the data 140 of the set-up signal 153 for pitch.

Figure 6C:
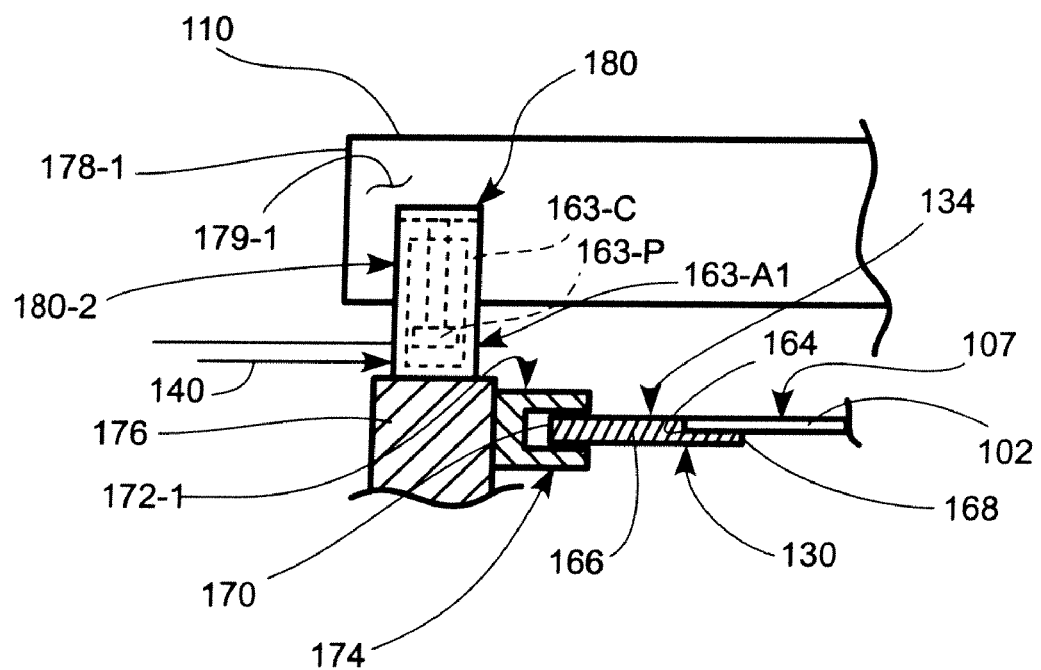
FIG. 6C is an elevational view of another embodiment of the proximity head configured with a physical parameter for automatic adjustment relative to the carrier.

Another specific configuration of the adjusters of array 162 is shown in FIG. 6C as adjuster 163-A1. FIG. 6C shows the head 110 configured with the physical parameter for adjustment of the head 110 relative to the carrier 130, which may be for tilt or pitch adjustment. That is, the physical parameter is the relative orientation of the plane 134 of the carrier 130 and the plane 114 of the proximity head 110. As described with respect to FIG. 6B, for ease of illustration the FIG. 6C embodiment of adjuster 163-A1 is illustrated only in terms of the side 178-1 and one face 179-1. It is to be understood that an adjuster 163-A1 may be provided at each side 178 and each face 179, i.e., as shown by adjusters 163 in FIG. 6A. In set-up, adjusters 163-A1 may each directly respond to the set-up signals 1430, through the program 150S. FIG. 6C shows adjusters 163-A1 configured with an embodiment of exemplary unit 180, referred to as unit 180-2, in lieu of the unit 180-1 of FIG. 6B. Unit 180-2 may be configured with a pneumatic adjuster in which a piston 163-P moves in a cylinder 163-C in response to the data 154-3 of signals 153. The cylinder 163-C may be mounted on the frame 176 and the piston 163-P may be secured to the head 110 to adjust the vertical position of the side 178-1 and face 179-1 of the head 110 relative to the carrier 130. In a manner similar to the tilt and pitch adjustments described with respect to FIGS. 6A & 6B, the amount of adjustment by the unit 180-2 at each side 178-1 and face 179-1 may be controlled (here directly by the data 140D of the signals 149) to adjust the orientation of the carrier plane 134 and the wafer plane 107 relative to each other as described above during set-up.

It may be understood then, that in both of the FIGS. 6B & 6C exemplary embodiments of the array 162, the described configurations of the head 110 include physical parameters for adjustment of the head 110 relative to the carrier 130 to avoid the tilt or the pitch. In this manner, the head plane 114 at each opposite side 178-1 and 178-2 of the head 110 may be spaced relative to the carrier plane 114 by the same values of the gap 101D. Also, the described configuration of the processor 150 generates the set-up signals 140 (that are similar to the meniscus monitor signals 153, except for the set-up conditions) so that the data 140 represents the quantitative adjustment amounts of the tilt or pitch at the opposite head sides 178 and faces 179 as separate identified physical parameters. The quantitative tilt adjustment amounts at each side 178 and face 179 allow the carrier and wafer to be moved into the desired relative orientation, i.e., the orientation with a uniform gap 101D that is specified by the next recipe 152 NCR that is to be used for the meniscus processing.

In review, FIG. 5 shows processor 150 configured to respond to the orientation monitor signals 148 and to the recipe 152. During exemplary meniscus processing operations on a wafer 102, the configured processor 150 responds to such signals 148 and to the current recipe 152CR that the apparatus 109 is currently running (i.e., executing). Such current recipe 152CR specifies the original process parameters OPP. As generally described above, the processor 150 generates meniscus monitor signals 153 that correlate to meniscus stability. With the signals 153 so correlated to meniscus stability, the signals 153 allow the stable configuration of the meniscus 104 to be maintained as described in more detail below.

Still referring to FIG. 5, embodiments of the apparatus 109 operate to correlate the signals 153 to meniscus stability in the following manner with respect to a current meniscus process. The processor 150 is shown in FIG. 5 configured to store the current recipe 152CR (with the current OPP) to provide one of the inputs for the correlation of the current gap value(s) of the current gap 101. The current signals 148 are input with the current recipe 152CR for correlation to meniscus stability. FIG. 5 shows the processor 150 configured with a correlation module 186, shown in more detail in FIG. 7. Referring to FIG. 7, a CPU 150C of the processor 150 executes the correlation module 186 to access a database 188 that stores a matrix 190. Matrix 190 comprises a list of gap values and corresponding process parameters NSPP, as shown in Table IV.

TABLE IV

MATRIX 190
Gap Values Known to Correspond to Process
Parameters Providing a Stable Meniscus

| Gap Value | Calibration Recipe 152CAL | In MAR Range (stable): Process Parameters NSPP |
| --- | --- | --- |
| T 1 | CAL1 | VT1 |
| T 2 | CAL2 | VT2 |
| P 1 | CAL3 | VP1 |
| P 2 | CAL4 | VP2 |
| TP 1 | CAL5 | VTP1 |
| TP 2 | CAL6 | VTP2 |

Table IV lists various exemplary gap values. Also, corresponding to each gap value Table IV gives an identification of a calibration recipe (or matrix recipe) 152CAL and an identification of process parameters (referred to as "NSPP", for New Stable Process Parameters) specified by the recipe 152CAL. In detail, for many gap values (as exemplified by the gap values listed in Table IV), it has been determined (by the calibration described below) that certain values of certain process parameters NSPP are known to provide a stable meniscus. For each gap value, Table IV identifies the calibration recipe 152CAL that specifies those certain values of the NSPP. As an example, gap value T1 may relate to a tilt orientation, parameters VT1 may identify the process parameters NSPP known to provide a stable meniscus for that gap value T1, and the corresponding calibration recipe 152CAL is CAL1. The other exemplary gap values of Table IV may relate to another tilt orientation (T2), or to one pitch orientation (P1), or to another pitch orientation (P2), or to a tilt and pitch orientation (TP1), or to another tilt and pitch orientation (TP2). It may be appreciated that for a particular configuration of the apparatus 109, a table similar to Table IV may identify other gap values within the scope of the above description, and those other gap values will have been determined (by the calibration described below) to provide the stable meniscus 104D when used with certain values of certain process parameters NSPP that correspond to a recipe 152CAL that is identified in that table.

Thus, if the current signals 148 represent a gap 101U with a gap value that is listed in Table IV, for that gap value there is a calibration recipe 152CAL with a set of process parameters NSPP for meniscus processing wherein the meniscus 104 will be stable. Based on matrix 190 (as exemplified by Table IV), the processor 150 running the correlation module 186 identifies the calibration recipe 152CAL that corresponds to (i.e., specifies) the current gap 101U. For that identified recipe 152CAL, the module 186 identifies the corresponding NSPP. As indicated, identified recipe 152CAL (with the corresponding NSPP) is known to provide a stable meniscus 104 for that gap 101U. The processor 150 running the correlation module 186 then compares the NSPP to the OPP, and for each OPP that is different from a corresponding NSPP, outputs one of the quantitative adjustment amounts ("QAA") shown in Table II. In one embodiment, the processor 150 running the correlation module 186 then uses the QAA to modify the current recipe 152CR to become a modified recipe 152MR. Recipe 152MR is written to a modified recipe database 192. The modified recipe 152MR may thus include (i) unmodified OPP of the current recipe 152CR, (ii) values of those OPP, (iii) an identification of each NSPP, and (iv) a value of each identified NSPP. For the values of each identified NSPP, the processor 150 running the correlation module 186 determines the difference between the value of the NSPP and the value of the corresponding OPP, the difference is the QAA for that NSPP, and the difference may be used to adjust the value of the corresponding OPP to the value of the NSPP. The recipe 152MR thus represents the result of the correlation, and with the apparatus 109 using the recipe 152MR (with the values of the unmodified OPP plus the values of the NSPP), the signals 153 output by the processor allow adjustment of only the NSPP for the meniscus 104U to be maintained in the stable configuration.

Figure 8A:
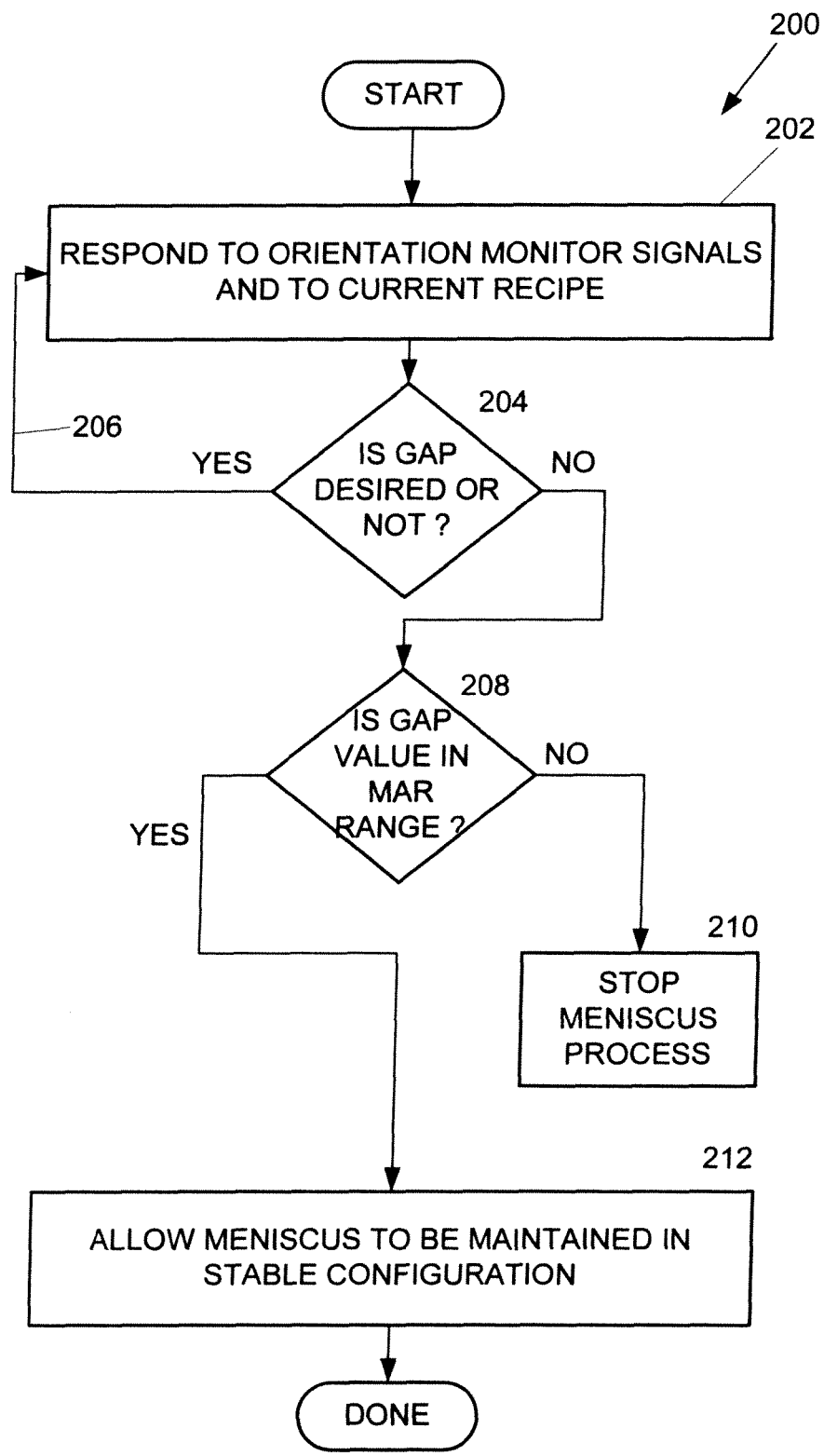
FIGS. 8A and 8B illustrate flow charts of a method under control of the correlation module to allow maintaining of the meniscus stability.

For such correlation, FIG. 7 shows the correlation module 186 of the processor 150 configured with correlation instructions, i.e., a computer program 194. A flow chart 200 shown in FIG. 8A indicates operations of a method under the control of the instructions 194. The method may move from start to an operation 202 of responding to the current recipe 152CR and to the orientation monitor signals 148. Operation 202 may include receiving inputs from the monitors 142, and OPP input from the recipe 152CR. The method moves to an operation 204 of determining whether the gap 101 is a desired gap 101D or not. In operation 204, reference is made to the current recipe 152CR to determine if the current gap value is GVD as specified in the recipe 152CR. A "yes" determination, i.e., GVD is in range AR, is thus desired. A no determination indicates not as so specified (i.e., GVD is out of range AR). From a yes determination, a loop 206 is taken and operation 202 is repeated for the current recipe 152CR. From a no determination, the method moves to operation 208. Operation 208 makes a determination as to whether the gap value of the current gap 101 is in the MAR range. In terms of Table I, for example, a determination of "no" means that the gap value of the current gap 101 is outside both of the AR and MAR ranges, and thus corresponds to a Column 3, Level 3T or Level 3P situation. For all gap values not in one of the AR range and the MAR range (i.e., "no" in operation 208), the intended allowing must not occur because of imminent wafer touching the head 110, for example. For this "no" determination in operation 208, the method moves to an operation 210 to stop the processing of the wafers 102. This determination is accompanied by processor 150 outputting the signals 153 with data 154-4 (Table I) to cause the process stoppage.

If a "yes" determination is made in operation 208, the undesired gap 101U is thus determined to exist because, although the gap value is not in the AR range, it is in the MAR range. In terms of Table I, the gap value thus corresponds to an exemplary Column 2, Level 2T or Level 2P situation, and the method moves to an operation 212. In operation 212, the meniscus 104 is allowed to be maintained in a stable configuration, and the continuous configuration described above with respect to FIGS. 2D and 2E continues, and the method is done.

Figure 8B:
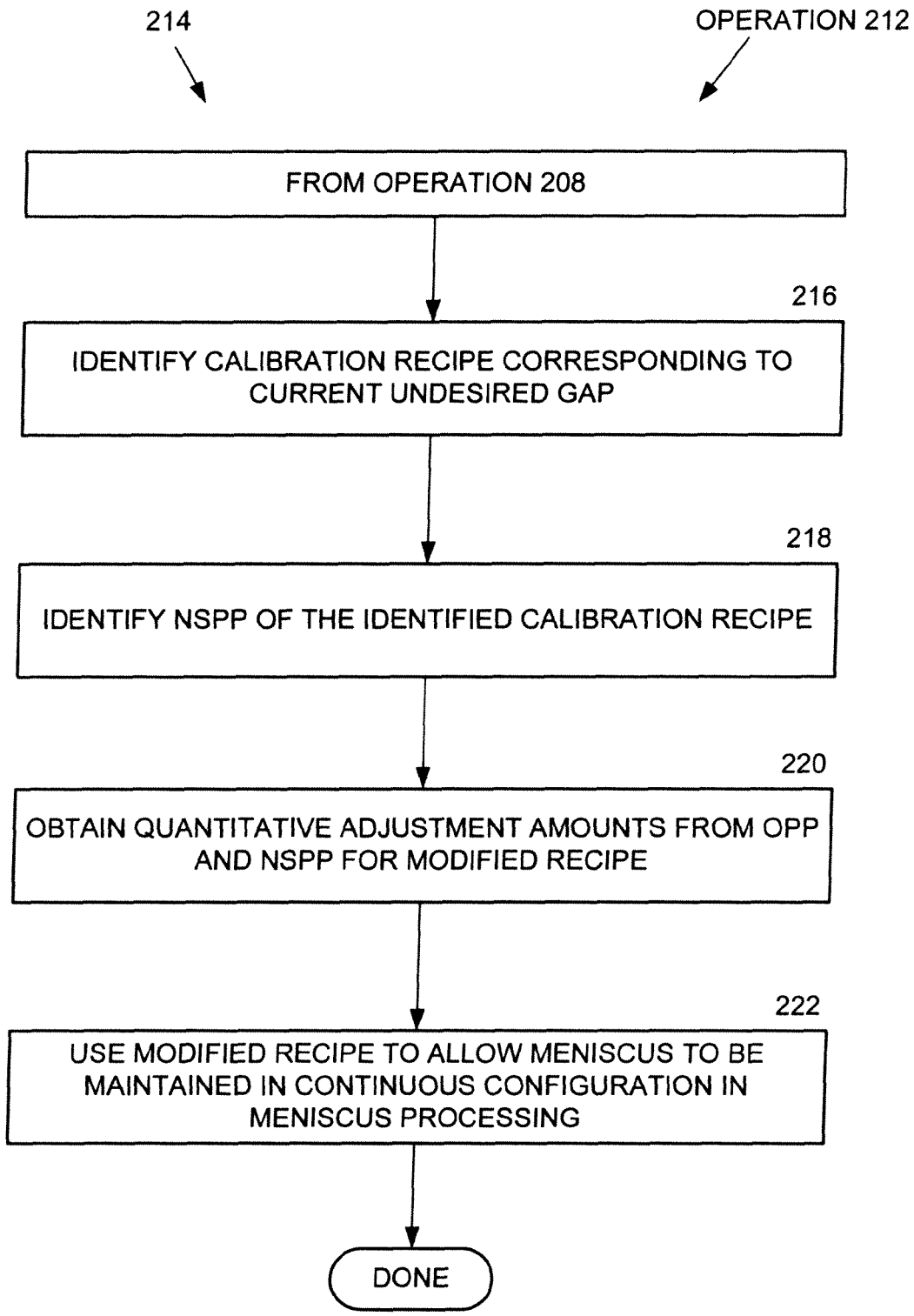

FIG. 8B shows a flow chart 214 illustrating how operation 212 may perform the described allowing. From operation 208, in suboperation 216 the processor 150 running the correlation module 186 identifies the one calibration recipe 152CAL that corresponds to the current gap 101U (gap 101U being represented by the current orientation monitor signal 148). "Corresponds to" indicates that the recipe 152CAL specifies a gap value equal to the gap value of the current gap 101U. For that identified recipe 152CAL, the method moves to suboperation 218 and identifies the corresponding NSPP, i.e., the NSPP specified by recipe 152CAL. Reference may be made to matrix 190 for this identifying of the corresponding NSPP. Table IV illustrates data for performing both suboperations 216 & 218, in that a gap value T1 (indicating tilt within the MAR range) has NSPP values shown as VT1. This may be referred to as an initial aspect of correlating the current gap 101U to a meniscus 104 that is stable for that gap 101U. The processor 150 running the correlation module 186 then moves to operation 220, and obtains an output by comparing those NSPP (of VT1) to the corresponding OPP of the current recipe 152CR. For each OPP that is different from a corresponding NSPP, operation 220 outputs a quantitative adjustment amount ("QAA") indicating the difference, such that the modified recipe 152MR is obtained. The processor 150 running the correlation module 186 then moves to suboperation 222, and uses the modified recipe 152MR to allow the meniscus 104 to be maintained stable during further meniscus processing. In operation 222, the processor 150 writes the recipe 152MR to the modified recipe database 192. The use of the modified recipe 152MR is via the next current signals 153 from the processor 150 (representing the modified recipe 152MR). The method of flow chart 214 may thus be done.

Figure 8C:
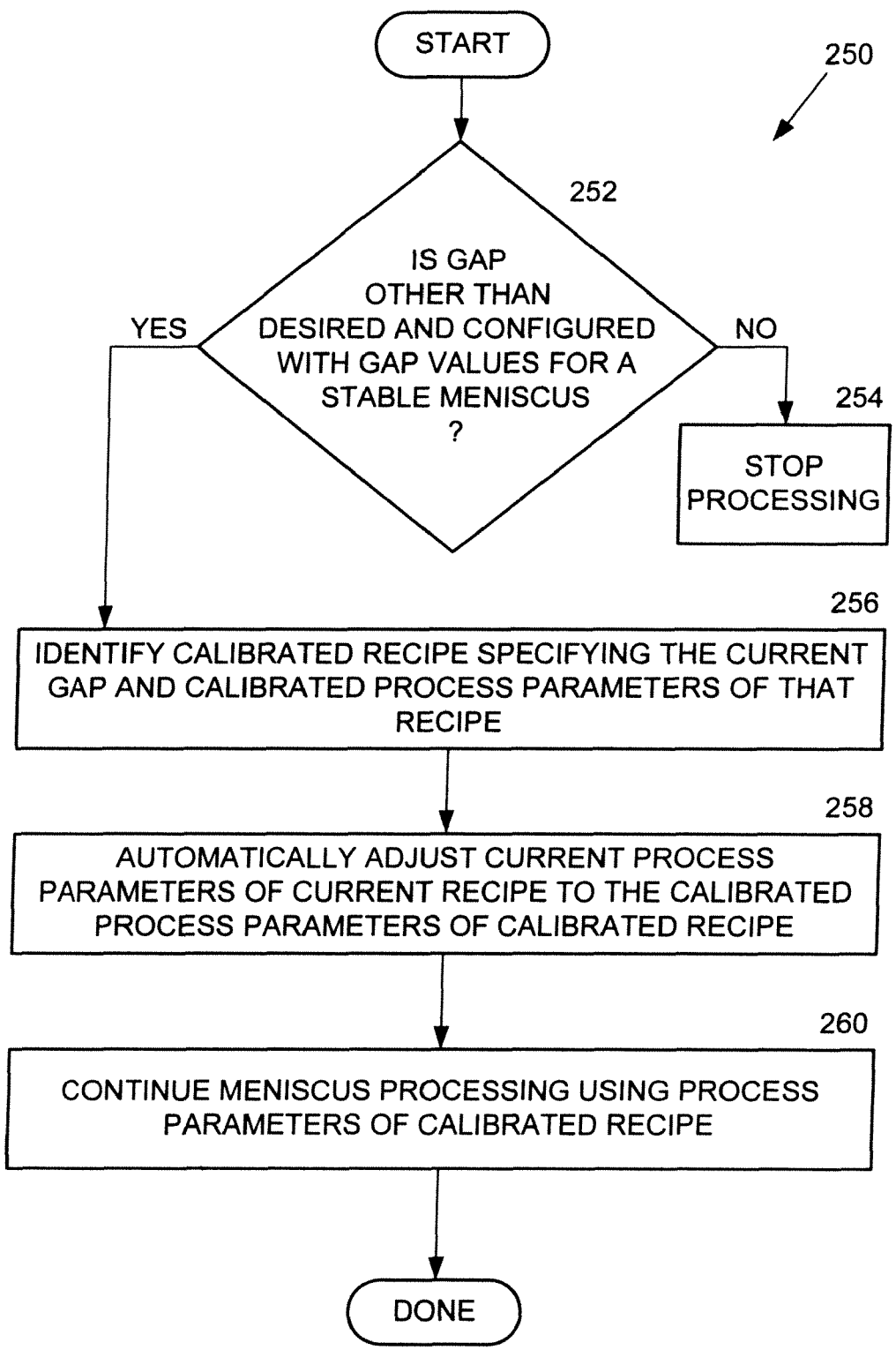
FIG. 8C illustrates a flow chart of a method of monitoring meniscus processing to automatically maintain a meniscus in a stable condition.

FIG. 5 was described above in terms of the data 154 of signal 153 applied to the process module 109MP by the allow-meniscus-stability program 150S. The allow-meniscus stability program 150S may be executed by the processor 150 to perform an embodiment of a method shown in FIG. 8C of monitoring meniscus processing of a wafer surface to maintain a meniscus in a stable condition. The method is shown in flow chart 250, and may monitor the meniscus processing by the meniscus 104 of the wafer surface 106 to maintain the meniscus 104 in the stable condition described above. The processing is in response to the current recipe 152CR that specifies the desired gap 101D between the wafer surface 106 and the proximity head 110. The current recipe 152CR may further define the process parameters OPP for the meniscus processing using the specified gap 101D. Flow chart 250 indicates operations of the method that may be under the control of instructions of the correlation program 186 and of program 150S. The method may move from start to an operation 252 of determining whether a current gap is other than a desired gap desired gap and is configured with gap values to allow the meniscus to be maintained in the stable condition. The determining may be by monitoring of the meniscus processing via the system 140, for example, and by the processor 150 running the correlation instructions 194 to determine whether the current gap, e.g., gap 101, is other than the desired gap 101D, e.g., is other than as shown in FIG. 2E. As described above, such determination may be that the current gap 101 is not desired because the gap 101 is the gap 101U, thus the current gap is other than desired.

Another aspect of the determination is whether the current gap is configured with gap values to allow the meniscus to be maintained in the stable condition. If the gap is a gap 101DIS, the answer is no, and a path is taken to operation 254. In one embodiment, operation 254 may be similar to operation 210 (FIG. 8A) and the processing is stopped.

A determination that the current gap 101 is gap 101, is as described above a determination that the current gap is configured with gap values GVU to allow the meniscus 104U to be maintained in the stable condition (e.g., meniscus 104U as shown in FIGS. 3A and 3B). Thus, gap 101U is neither gap 101D nor gap 101DIS. This is a yes determination of operation 252, and the method moves to operation 256.

Operation 256 identifies (i) a calibration recipe that specifies the current gap and (ii) calibrated process parameters for use in establishing a stable meniscus across the current gap. Operation 256 may be performed, and if the current signals 148 represent a gap 101U with a gap value that is listed in Table IV, for that gap value there is a calibration recipe 152CAL with a set of process parameters NSPP for meniscus processing wherein the meniscus 104 will be stable. Based on matrix 190 (as exemplified by Table IV), in operation 256 the processor 150 running the correlation module 186 identifies the calibration recipe 152CAL that has a gap value that corresponds to the current gap 101U. For that identified recipe 152CAL, the module 186 identifies the corresponding NSPP. In one embodiment, operation 256 may include suboperation 216 (FIG. 8B) in which the processor 150 running the correlation module 186 identifies the one calibration recipe 152CAL that corresponds to the current gap 101U (gap 101U being represented by the current orientation monitor signal 148). The recipe 152CAL specifies a gap value equal to the gap value of the current gap 101U. For that identified recipe 152CAL, operation 256 may also include suboperation 218 and identify the corresponding NSPP, i.e., the NSPP specified by recipe 152CAL. Reference may be made to matrix 190 for this identifying of the corresponding NSPP. The method may move from operation 258 to an operation 256 of automatically adjusting the process parameters of the current recipe to the process parameters of the identified calibration recipe. In operation 258 the execution of the allow-meniscus stability program 150S by the processor 150 may obtain an output in the form of signal 153 with the data 154. Data 154 is obtained by comparing the NSPP specified by the identified recipe 152CAL to the corresponding OPP of the current recipe 152CR. For each OPP that is different from a corresponding NSPP, operation 258 outputs a quantitative adjustment amount ("QAA") indicating the difference, such that the modified recipe 152MR is obtained and is output as the signal 153. The method then moves to operation 260, and continues the meniscus processing of the wafer surface using the process parameters specified by the identified calibration recipe. In operation 260, the allow-meniscus stability program 150S uses the modified recipe 152MR to input the modified parameters PRPM to the meniscus process 109MP. The process 109MP responds to the modified parameters PRPM in the same manner as process 109MP responds to the OPP specified by the original (or current) recipe 152CR that has been modified, except that the parameters PRPM that have been modified change the process conditions so that the meniscus 104U is stable even though the meniscus 104U has the gap value 101GVU that is less desired than gap value GVD. In one embodiment, the method may be done.

One embodiment may provide a method for calibrating apparatus for processing surfaces of the wafer using the meniscus. The processing, e.g., may be of the surface 106 of the wafer 102 using meniscus 104. The apparatus may be apparatus 109 including carrier 130, proximity head 110, system 140, and processor 150, for example. The above set up may be used to set up the proximity head 110 with a series of tilt values, then pitch values, then combined tilt and pitch values, all for undesired values GVCAL of the undesired gaps 110U. The gap value GVCAL for each set up is recorded. For each such value GVCAL, a determination is made of a complete set of process parameters PPCAL by which the meniscus 104 is stable (i.e., in the continuous configuration) even though the gap is non-uniform and thus less desired than gap 101D. Stability of the meniscus may be determined by a meniscus observation described above. Such observation may, for example, determine that, over a time period that is in the range described above with respect to range MARPRO, the meniscus is stable (i.e., remains as shown in FIGS. 3A and/or 3B). That set of process parameters PPCAL and that value GVCAL are identified for one calibration recipe 152CAL. This process of making recipes 152CAL is repeated with respect to many tilt, pitch & and combination configurations until a full series of calibration recipes 152CAL is obtained for a wide range of less desired gaps 101U. Data for such recipes 152CAL is entered in the matrix 190 for use as described above, and the data may be arranged as in Table IV.

In review, in the calibration, the entry into the database 188 of the respective gap value data GVCAL corresponding to use of each recipe 152CAL provides the desired gap value data GVCAL based on actual use of the apparatus 109 and of the recipe 152 that is to be used for processing multiple other wafers 102 with a stable meniscus 104.

It may be understood, then, that the embodiments fill the above need by monitoring processing of the surfaces 106 of the wafer 102 by the recipe-controlled meniscus 104. The processor 150 configured for response to orientation monitor signals 148 allow maintaining meniscus stability, as defined above. The orientation monitor signals 148 allow this meniscus stability by maintaining the meniscus configuration in one continuous length (FIGS. 2D & 2E) between process monitoring beams 144 and extending continuously across the gap 101D between the fluid emitter surface 112 of the proximity head 110 and the wafer surface 106. The needs are further filled by the above-described calibration data (Table IV) that defines recipes 152CAL corresponding to the stable meniscus 104. In meniscus processing using the current recipe 152CR, identification of an undesired gap 101 is correlated to such calibration data to allow meniscus processing to be maintained (i.e., continue) with a stable meniscus 104 in the various ways described above. By filling these needs, the system 109 avoids damage to the wafer 102 due to the head 110 touching the wafer, while allowing the wafer diameter D to be longer in the Y direction and allowing the relative movements between the wafer 102 and the head 110 in the X direction to be at an increased rate, for example.

For more information on the operation of the meniscus process module 109MP, e.g., for the formation of the meniscus 104 and the application of the meniscus to the surface of a substrate, reference may be made to: (1) U.S. Pat. No. 6,616,772, issued on Sep. 9, 2003 and entitled "METHODS FOR WAFER PROXIMITY CLEANING AND DRYING,"; (2) U.S. patent application Ser. No. 10/330,843, filed on Dec. 24, 2002 and entitled "MENISCUS, VACUUM, IPA VAPOR, DRYING MANIFOLD," (3) U.S. Pat. No. 6,998,327, issued on Jan. 24, 2005 and entitled "METHODS AND SYSTEMS FOR PROCESSING A SUBSTRATE USING A DYNAMIC LIQUID MENISCUS," (4) U.S. Pat. No. 6,998,326, issued on Jan. 24, 2005 and entitled "PHOBIC BARRIER MENISCUS SEPARATION AND CONTAINMENT," and (5) U.S. Pat. No. 6,488,040, issued on Dec. 3, 2002 and entitled "CAPILLARY PROXIMITY HEADS FOR SINGLE WAFER CLEANING AND DRYING," each is assigned to Lam Research Corporation, the assignee of the present application, and each is incorporated herein by reference.

For additional information regarding the functionality and constituents of Newtonian and non-Newtonian fluids, reference can be made to: (1) U.S. application Ser. No. 11/174,080, filed on Jun. 30, 2005 and entitled "METHOD FOR REMOVING MATERIAL FROM SEMICONDUCTOR WAFER AND APPARATUS FOR PERFORMING THE SAME"; (2) U.S. patent application Ser. No. 11/153,957, filed on Jun. 15, 2005, and entitled "METHOD AND APPARATUS FOR CLEANING A SUBSTRATE USING NON-NEWTONIAN FLUIDS"; and (3) U.S. patent application Ser. No. 11/154,129, filed on Jun. 15, 2005, and entitled "METHOD AND APPARATUS FOR TRANSPORTING A SUBSTRATE USING NON-NEWTONIAN FLUID," each of which is incorporated herein by reference.

The proximity head 110 and operations that manage and interface with the fluid supply and control parameters for the meniscus 104 may be controlled in an automated way using the computer control via the processor 150. Thus, aspects of the invention may be practiced with other computer system configurations including hand-held devices, microprocessor systems, microprocessor-based or programmable consumer electronics, minicomputers, mainframe computers and the like. The embodiments of the present invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the embodiment of the present invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method of monitoring meniscus processing of a wafer surface to stabilize a meniscus, the processing being in response to a current recipe that defines a desired gap between the wafer surface and a proximity head, the method comprising the operations of:
    monitoring current meniscus processing to determine that a current gap is other than the desired gap;
    identifying a calibration recipe that specifies the current gap; and
    continuing the meniscus processing of the wafer surface using process parameters specified by the identified calibration recipe.

2. A method as recited in claim 1, further comprising the operations of:
    first determining whether the current gap is within a range of acceptable gaps, wherein the gaps in the range correspond to meniscus processing with a stable meniscus; and
    only if the current gap is within the range of acceptable gaps, performing the identifying and continuing operations.

3. A method as recited in claim 1, further comprising the operations of:
    first determining whether the current gap is within a range of acceptable gaps, wherein the gaps in the range correspond to meniscus processing with a stable meniscus; and
    if the current gap is not within the range of acceptable gaps, discontinuing the meniscus processing operation.

4. A method as recited in claim 1, wherein the identifying operation comprises an operation of reviewing a plurality of calibrated recipes each of which is known to specify process parameters for a stable meniscus.

5. A method as recited in claim 4, wherein the identifying operation comprises the further operations of:
    matching the current gap with a gap specified by one of the plurality of calibration recipes that specifies a gap that is the same as the current gap; and
    identifying the process parameters of the one calibration recipe for use in the continuing operations.

6. A method as recited in claim 5, wherein the operation of continuing the meniscus processing of the wafer surface comprises the operations of:

adjusting the process parameters of the current recipe to conform to the process parameters specified by the identified one calibration recipe to define a new current recipe; and using the process parameters of the new current recipe in the continuing operation to process the wafers.

7. A method as recited in claim 6, wherein the method comprises the further operations of:

generating a process control signal representing the process parameters of the new current recipe; and performing the adjusting operation automatically in response to the process control signal so that the using operation processes the wafers using the process parameters specified by the new current recipe.

8. A method as recited in claim 6, wherein the adjusting operation comprises manually causing the process parameters of the current recipe to be adjusted to conform to the process parameters specified by the identified calibration recipe.

9. A method of monitoring meniscus processing of a wafer surface to maintain a a meniscus in a stable condition, the processing being in response to a current recipe that specifies a desired gap between the wafer surface and a proximity head, the current recipe further specifying process parameters for the meniscus processing, the method comprising the operations of:

monitoring current meniscus processing to determine whether a current gap is other than a desired gap and is configured with gap values to allow the meniscus to be maintained in the stable condition;

if the current gap is determined to be other than the desired gap and is so configured, identifying a calibration recipe that specifies the current gap and calibrated process parameters for use in establishing a stable meniscus across the current gap;

automatically adjusting the process parameters of the current recipe to the process parameters of the identified calibration recipe; and continuing the meniscus processing of the wafer surface using the process parameters specified by the identified calibration recipe.

\* \* \* \* \*